United States Patent
Ho et al.

(10) Patent No.: US 12,374,588 B2
(45) Date of Patent: * Jul. 29, 2025

(54) METHOD FOR EVALUATING NON-UNIFORM STRESS

(71) Applicant: Taiwan Semiconductor Manufacturing Co., Ltd., Hsinchu (TW)

(72) Inventors: Wei-De Ho, Hsinchu (TW); Han-Wei Wu, Hsinchu (TW); Pei-Sheng Tang, Hsinchu (TW); Meng-Jung Lee, Hsinchu (TW); Hua-Tai Lin, Hsinchu (TW); Szu-Ping Tung, Hsinchu (TW); Lan-Hsin Chiang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 315 days.

This patent is subject to a terminal disclaimer.

(21) Appl. No.: 17/872,894

(22) Filed: Jul. 25, 2022

(65) Prior Publication Data

US 2022/0359313 A1 Nov. 10, 2022

Related U.S. Application Data

(62) Division of application No. 16/810,607, filed on Mar. 5, 2020, now Pat. No. 11,804,410.

(60) Provisional application No. 62/893,731, filed on Aug. 29, 2019.

(51) Int. Cl.
*H01L 21/66* (2006.01)
*H01L 21/67* (2006.01)

(52) U.S. Cl.
CPC ........ *H01L 22/12* (2013.01); *H01L 21/67288* (2013.01)

(58) Field of Classification Search
CPC ............... H01L 21/67288; H01L 22/12; G01L 1/00–26
See application file for complete search history.

(56) References Cited

U.S. PATENT DOCUMENTS

| 11,804,410 B2 * | 10/2023 | Ho ..................... H01L 21/67288 |
| 2003/0025202 A1 | 2/2003 | Mikagi et al. |
| 2007/0192058 A1 * | 8/2007 | Ishibashi ............... G01B 11/306 702/155 |
| 2017/0271214 A1 * | 9/2017 | Kasa ....................... H01L 22/12 |
| 2018/0308971 A1 * | 10/2018 | Walecki .................. H01L 22/14 |
| 2020/0091089 A1 * | 3/2020 | Ko ......................... H01L 21/304 |
| 2020/0292947 A1 * | 9/2020 | Poiesz ................. G03F 7/70716 |

FOREIGN PATENT DOCUMENTS

| TW | 201909393 A | 3/2019 |
| TW | 201923954 A | 6/2019 |

* cited by examiner

*Primary Examiner* — William B Partridge
*Assistant Examiner* — Gustavo G Ramallo
(74) *Attorney, Agent, or Firm* — Seed IP Law Group

(57) ABSTRACT

A method for evaluation of thin film non-uniform stress using high order wafer warpage, the steps including measuring a net wafer warpage across a wafer area due to thin film deposition, fitting a two dimensional low-order polynomial to the wafer warpage measurements and subtracting the low-order polynomial from the net wafer warpage across the wafer area.

20 Claims, 20 Drawing Sheets

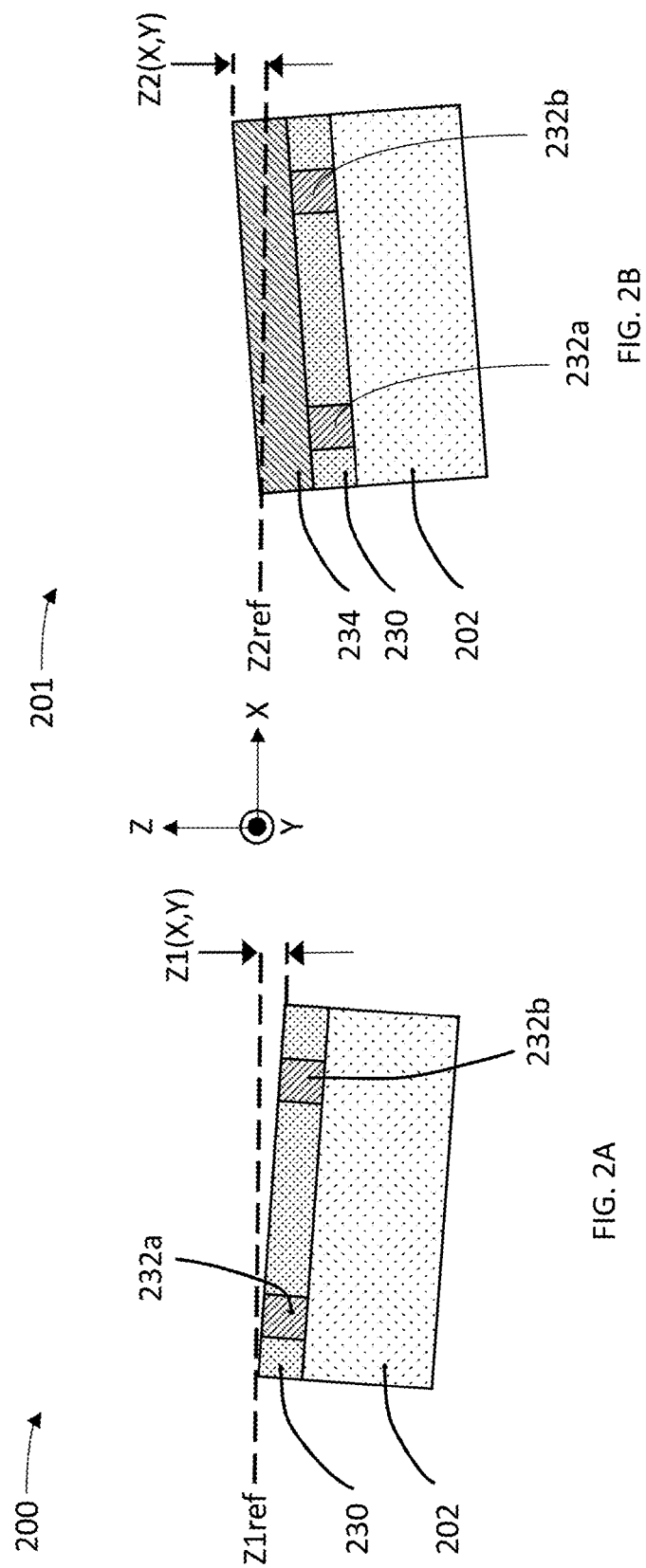

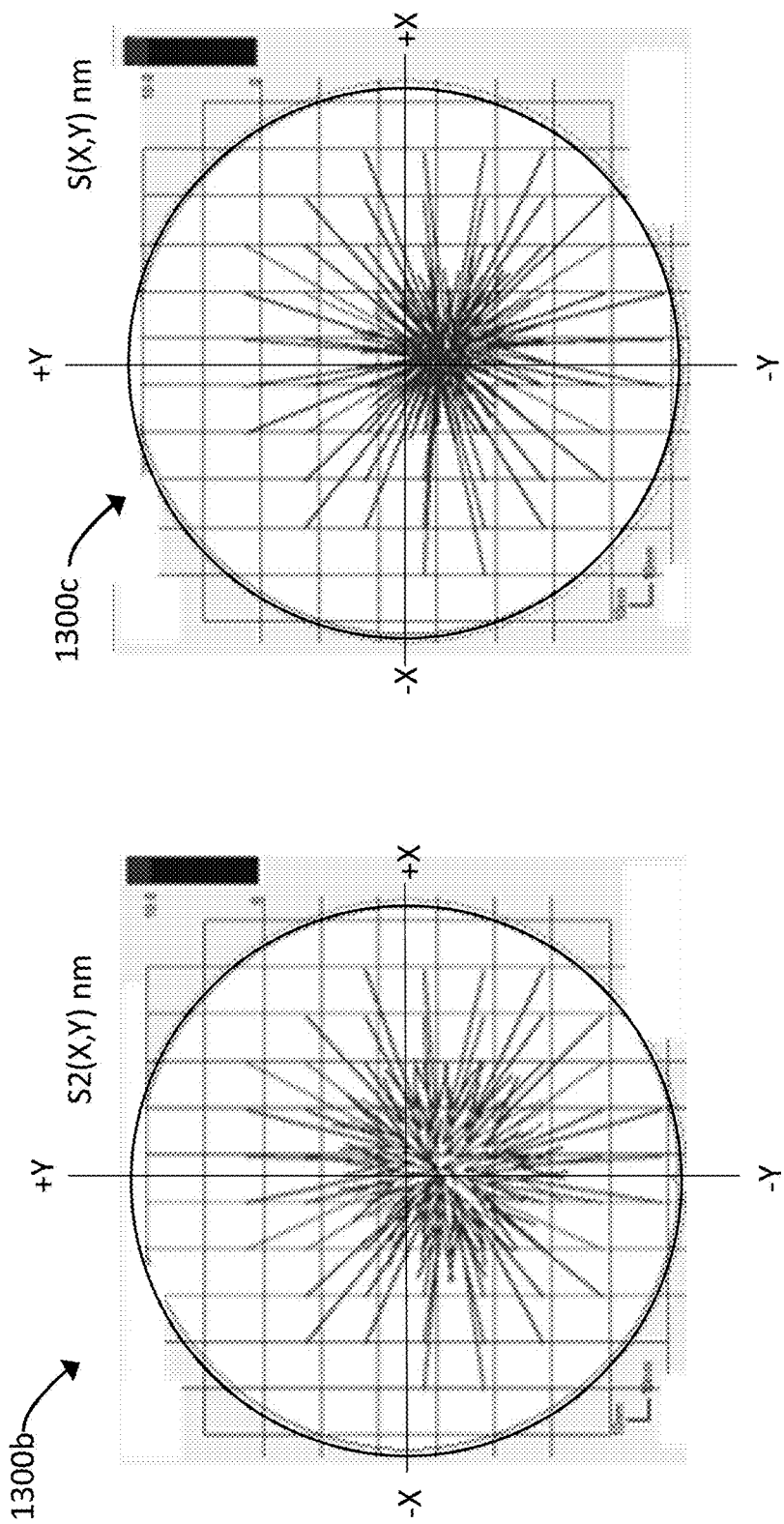

METHOD FOR EVALUATING NON-UNIFORM STRESS

BACKGROUND

Thin films deposited or grown on a semiconductor wafer may have stresses which cause overlay (OVL) residue, or alignment error, in a subsequent lithography process. Overlay residue describes a lithographic alignment error from a layer to a next photoresist pattern and adversely affects integrated circuit (IC) yield. Semiconductor processes below 5 nm feature sizes have tight OVL residue specifications to increase IC yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a schematic side view of a portion of a semiconductor wafer illustrating a first wafer warpage Z1(X, Y) before deposition of a thin film, according to some embodiments.

FIG. 2B is a schematic side view of a portion of the semiconductor wafer illustrating a second wafer warpage Z2(X,Y) after deposition of a thin film, according to some embodiments.

FIGS. 13A-13C are FIWA wafer maps illustrating use of the method of FIG. 10 to determine high order stress in a thin film F.

DETAILED DESCRIPTION

Figure 1:
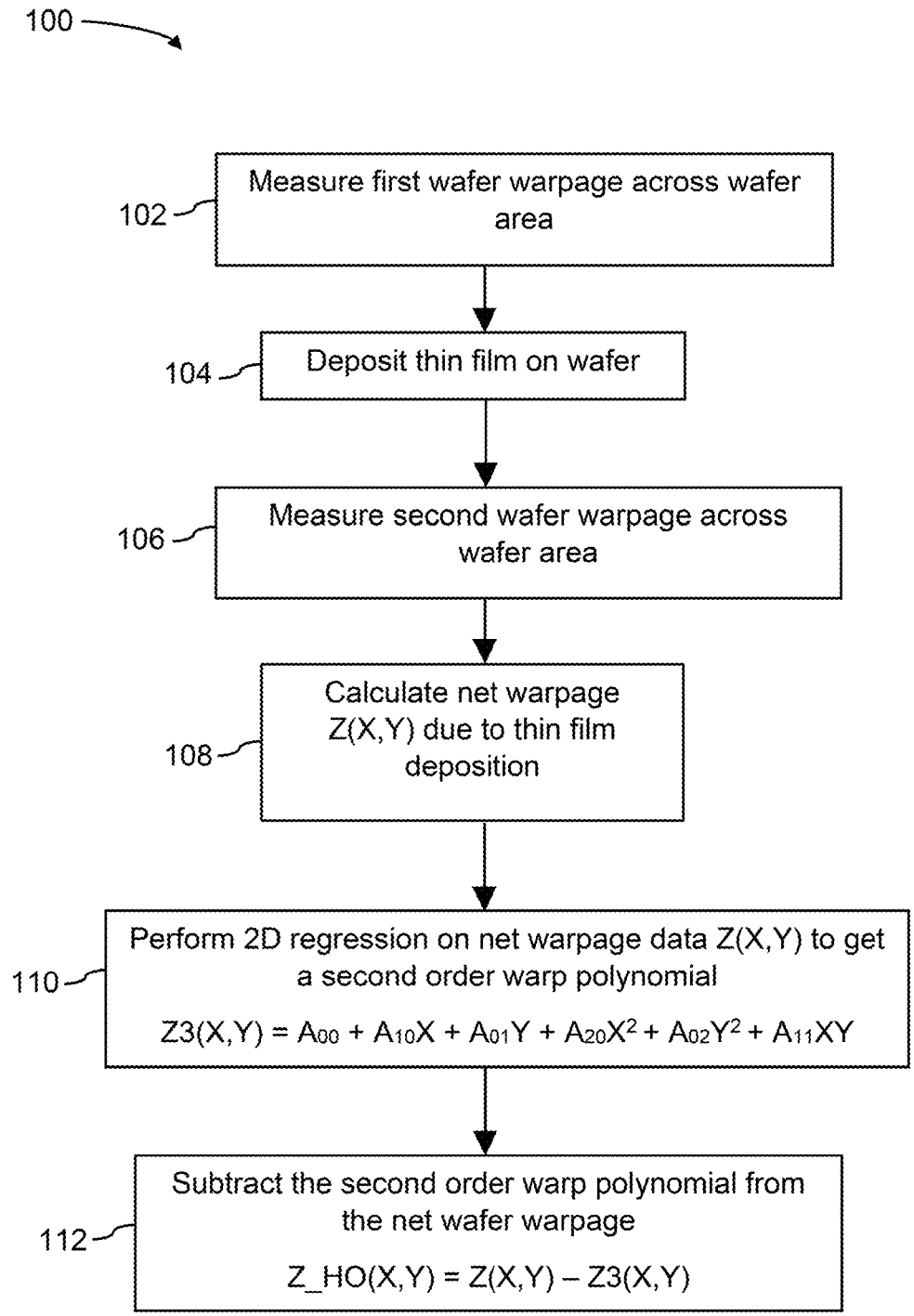
FIG. 1 is a flowchart of a method to determine a high order warpage Z_HO(X,Y), according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Below 5 nm semiconductor technology, process margins are small and high order OVL limits are tight to achieve high performing semiconductor devices. High-order OVL residue is challenging to minimize and control and is usually induced by non-uniform film stress. Generally, with or without the thin film, the global wafer shape distortion is described by wafer warpage; however, after a thin film has been deposited on a wafer, the wafer warpage has low correlation to high order OVL residue. In accordance with embodiments described herein, the inventors have found that a high order wafer warpage, due to thin film deposition, correlates strongly with high order overlay residue, high order film stress and presence of peeling defects in the deposited thin film. Accordingly, in accordance with some embodiments described herein, a high order wafer warpage examination (before and after thin film deposition) is used in processes to reduce or prevent high order OVL residue, high order film stress and/or peeling defects in a deposited thin film resulting from non-uniform stress in a deposited thin film. In accordance with embodiments of the present disclosure, a high order wafer warpage examination (before and after thin film deposition) utilizes a fine wafer alignment measurement before and after film deposition or utilizes a wafer warpage measurement (before and after thin film deposition) for determining high order wafer warpage. In accordance with embodiments of the present disclosure, results of the high order wafer warpage measurement are used in processes to reduce or prevent high order OVL residue, high order film stress and/or peeling defects in a deposited thin film resulting from non-uniform stress in a deposited thin film.

A top surface of a semiconductor wafer for integrated circuits (IC) may lie in an X-Y plane for photolithography operations. During a photolithography process an overlay residue, or overlay error, in the X-Y plane, is measured between an IC layer and a next photoresist pattern on the IC in a semiconductor process. As an example, in steps before a thin film is deposited, first overlay marks are created on the semiconductor wafer using a material such as silicon dioxide, silicon nitride, metal or another material compatible with a semiconductor process. Next, a thin film is deposited on the semiconductor wafer. Such thin film may cause the wafer to warp due to stresses in the thin film. After the thin film deposition, the semiconductor wafer is moved to a photolithography area to create a photoresist pattern on the thin film, usually for patterning the thin film. Second overlay marks are part of the photoresist pattern. The location of these second overlay marks may be compared to the location of the corresponding first overlay marks. An overlay residue, or distance mismatch, between the location of the first overlay marks and the location of the second overlay marks in the X-Y plane are measured by an examination of the semiconductor wafer from above. The overlay residue is measured in both X and Y directions and is represented as an overlay error vector at measurement locations (X,Y) of the overlay marks on the semiconductor wafer.

A thin film process whereby a thin film is deposited or otherwise formed on a semiconductor wafer may affect the high order overlay residue OVL(X,Y) due to non-uniform stresses in the thin film deposited or grown. In accordance with disclosed embodiments, overlay measurements for a semiconductor wafer are used to modify the operating conditions of the thin film process for purposes of reducing internal stress in the thin film that is deposited or otherwise formed on subsequent semiconductor wafers. A time delay between the thin film deposition and the overlay residue measurement, may range from hours to days. Long time delays between the thin film deposition and the overlay residue measurement will introduce instability in the thin film deposition process, e.g., by failing to adjust the thin film process in a way that stress in the deposited thin films is reduced. Estimating or predicting these high order overlay residues OVL(X,Y) due to thin film stress, as soon as possible after the thin film is deposited on the semiconductor wafer, avoids such instability in the thin film deposition process that time delay between the thin film deposition and the overlay residue measurement naturally causes. Estimating or predicting these high order overlay residues OVL(X,Y) due to thin film stress as soon as possible after the thin film is deposited on the semiconductor wafer allows for adjustment in process parameters of the thin film formation process in the interim while a high order overlay residue measurement is made. The correlation of high order wafer warpage measurement to high order overlay residue OVL (X,Y) allows a high order wafer warpage examination (before and after thin film deposition) to be used as an aid in controlling the thin film deposition process before completing measurements of high order overlay residues. Because, wafer warpage measurement after thin film deposition can be completed with less delay compared to the delay involved when determining or measuring high order overlay residue, the thin film deposition process may be adjusted based on the wafer warpage measurement information with less time delay compared to when measured or otherwise determined high order overlay residue are used to decide what changes should be made to the thin film deposition process to reduce stress in the formed thin film.

In accordance with disclosed embodiments, wafer warpage is measured in a Z direction, normal to an average X-Y plane of the semiconductor wafer using, for example, an interferometer. Warpage measurements across the semiconductor wafer may be fit to a polynomial having low and high order terms. Polynomials fit to warpage measurements of a semiconductor wafer are termed warpage polynomials, for the purposes of the present application. Warpage polynomial terms of the third order and above are termed high order warpage terms. In an embodiment, a sum of high order warpage terms is calculated for each warpage measurement location (X,Y) on the semiconductor wafer. A second order warpage polynomial is determined by fitting a set of net warpage measurements Z(X,Y) to a second order polynomial. To determine a high order wafer warpage for each measurement location (X,Y), the second order warpage polynomial is evaluated and subtracted from the net warpage measurement Z(X,Y).

The inventors of the present application have also determined that peeling events or peeling defects may be correlated to high order warpage. A peeling event occurs when a portion of a thin film detaches, or peels, from the substrate the thin film was deposited on.

An embodiment of a method for determining high order wafer warpage, caused by high order, or non-uniform, film stress, using measurements of semiconductor wafer warpage will be described. FIG. 1 is a method 100 for determining a high order warpage Z_HO(X,Y) across an area of a semiconductor wafer upon which a thin film has been deposited or otherwise formed. In accordance with disclosed embodiments, the high order wafer warpage Z_HO(X,Y) is correlated to overlay residues across the semiconductor wafer.

In a first step 102, prior to a thin film deposition, a first set of warpage measurements Z1(X,Y) are taken across a 2-dimensional (X and Y) semiconductor wafer area using a warpage measurement device. Examples of warpage measurement devices include an interferometer, a micrometer, and confocal multi-color sensors. Other methods of warpage measurement may be employed, which are known in the industry. Embodiments in accordance with the present disclosure are not limited to obtaining warpage measurements using the foregoing warpage measurement devices. The first set of warpage measurements Z1(X, Y) are taken utilizing a first surface of the semiconductor wafer prior to the thin film being deposited. In accordance with embodiments of the present disclosure, warpage measurements can be obtained from other surfaces of the semiconductor wafer.

In step 104, the thin film is deposited onto the first surface of the semiconductor wafer. In step 106, following the deposition of the thin film, a plurality of second set of warpage measurements Z2(X,Y) are taken across the semiconductor wafer at the same measurement locations (X, Y) as the location where the first set of warpage measurements Z1(X,Y) were taken. In some embodiments, a surface of the formed thin film opposite the first surface of the semiconductor wafer is used for the second warpage measurements. Other surfaces, such as a second surface of the semiconductor wafer opposite the first surface of the semiconductor wafer may be used.

In accordance with disclosed embodiments, in step 108, a set of net wafer warpage measurements Z(X, Y) due to thin film deposition is determined by subtracting the first set of warpage measurements Z1(X,Y) from the second set of warpage measurements Z2(X, Y) for each measurement location (X,Y) across the semiconductor wafer.

$$Z(X,Y)=Z2(X,Y)-Z1(X,Y)$$

in accordance with disclosed embodiments, in step 110, a two dimensional polynomial fit is performed on the set of net wafer warpage measurements Z(X, Y) as a function of coordinates X and Y, to create a second order warpage polynomial Z3(X,Y).

$$Z3(X,Y)=A_{00}+A_{10}X+A_{01}Y+A_{20}X^2+A_{02}Y^2+A_{11}XY$$

Various computer numerical analysis tools are available to perform a two dimensional, or two independent variable, regression, or fit, resulting in coefficients $A_{00}$, $A_{10}$, $A_{01}$, $A_{20}$, $A_{02}$ and $A_{11}$. As with other regressions, the resultant polynomial may be plotted across X and Y ranges for which the first and second set of warpage measurements Z1(X, Y) and Z2(X,Y) were taken in order to check that the regression algorithm did not result in unusually large deviations from the measured warpage within the X and Y ranges. Adjustment of regression criteria specific to the numerical analysis tool may be needed to reduce any unusually large deviations from the measured warpage within the X and Y ranges.

In step 112, a high order warpage Z_HO(X,Y) is determined by subtracting the second order warpage polynomial Z3(X,Y) from the set of net wafer warpage measurements Z(X,Y) for each measurement location (X,Y).

$$Z\_HO(X,Y)=Z(X,Y)-Z3(X,Y)$$

Figure 2D:
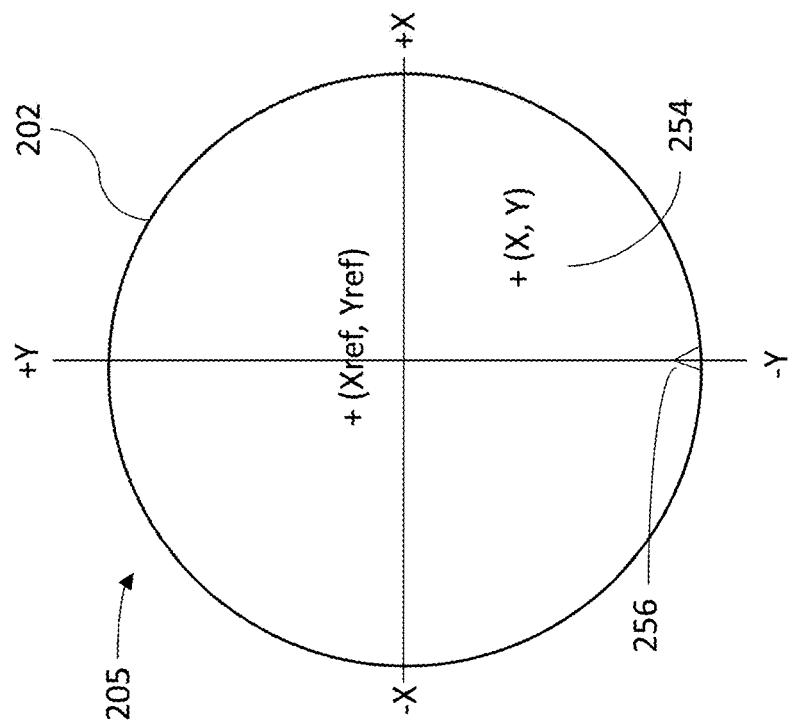
FIG. 2D is a top view of the semiconductor wafer, a surface of the semiconductor wafer being substantially parallel to an XY plane, according to some embodiments.
Figure 2C:
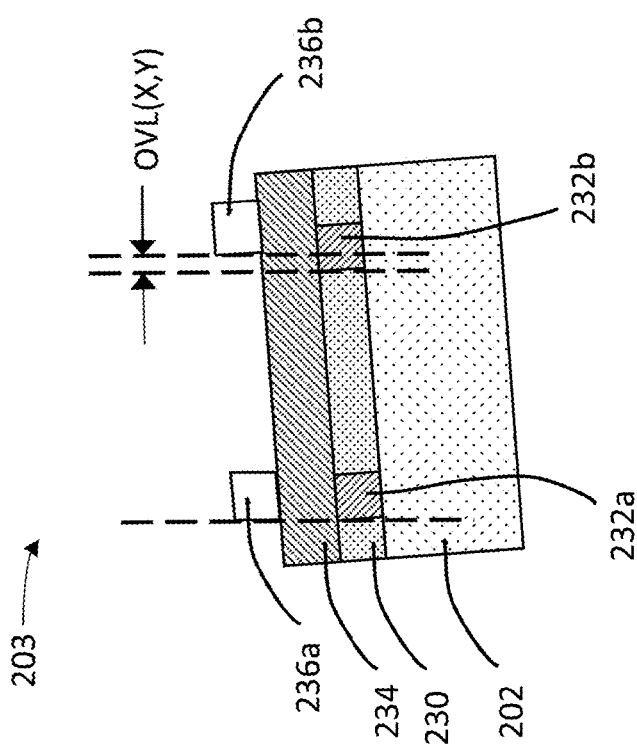
FIG. 2C is a schematic side view of a portion of the semiconductor wafer illustrating a measured high order overlay residue OVL(X,Y) after deposition of the thin film and after a photoresist has been deposited, exposed and developed on top of the thin film, according to some embodiments.

FIG. 2A, is a schematic side view portion 200 of semiconductor wafer 202 shown having a first warpage Z1(X,Y). The semiconductor wafer 202 is shown having a dielectric layer 230 and first overlay marks 232a and 232b prior to deposition of a thin film. In the illustrated semiconductor wafer 202, the first warpage Z1(X,Y) is illustrated with reference to a first reference plane Z1ref, parallel to the X-Y plane and is established by a measurement in the Z axis taken at a reference location (Xref, Yref) (see FIG. 2D). X, Y and Z axes are shown for reference, being shared by FIGS. 2A and 2B. For clarity, only linear warpage is shown in FIGS. 2A-C. However, it is understood that second, third and higher orders of warpage may be present.

FIG. 2B is a schematic side view portion 201 and is a side view portion 200 of FIG. 2A after a thin film 234 has been deposited onto dielectric layer 230. The semiconductor wafer 202 has a second warpage Z2(X,Y), after thin film 234 deposition. The second warpage Z2(X,Y) is illustrated with reference to a second reference plane Z2ref, parallel to the X-Y plane, and is established by a measurement in the Z axis taken at the reference location (Xref, Yref) (see FIG. 2D). Warpage measurements may be in the range of 0.1 to 10 microns (μm) with a precision in the range of 0.1 μm.

FIG. 2C is a schematic side view portion 203 including side view portion 201 of FIG. 2B after photoresist overlay marks 236a and 236b have been deposited and patterned onto thin film 234. In accordance with embodiments of the present disclosure, overlay marks 236a and 236b are compared with overlay marks 232a and 232b respectively. Overlay mark 232a is used to align the photolithography mask, resulting in very little alignment error, or overlay residue, between overlay mark 232a and 236a. However, stress in the thin film 234 has caused wafer 202 to warp, causing high order overlay residue OVL(X,Y) between overlay marks 232b and 236b. In accordance with embodiments of the present disclosure, high order overlay residue OVL(X,Y) is measured and compared with the determined high order warpage Z_HO(X,Y) for the measurement location (X,Y) (see FIG. 2D) on semiconductor wafer 202.

FIG. 2D is a top down view 205 of semiconductor wafer 202 having a reference location (Xref, Yref) marked, thin film 234 having a surface 254 and one of a set of measurement locations (X,Y) on the semiconductor wafer 202. One or more wafer reference marks 256 on the semiconductor wafer 202 may be used to orient the semiconductor wafer 202 with respect to the X and Y axes. While reference location (Xref, Yref) may be chosen anywhere on the semiconductor wafer 202, it is useful to choose a convenient location such as a center of the semiconductor wafer 202.

The overlay marks shown in FIGS. 2A-2D are simple examples chosen for explanation of overlay residue. Overlay marks used in the industry are known and may be much more complex than the overlay marks shown.

FIGS. 3A-5C are examples of semiconductor wafers having thin film deposited thereon and correlations between the high order warpage determined according to the method of FIG. 1 and measured high order overlay (OVL) residues described with reference to FIGS. 2A-2D. In FIGS. 3A-5D, wafer warpage measurements before and after thin film deposition were made using an interferometer directed to a side of the semiconductor wafer onto which a thin film will be or was, deposited.

Figures 3A, 3B:
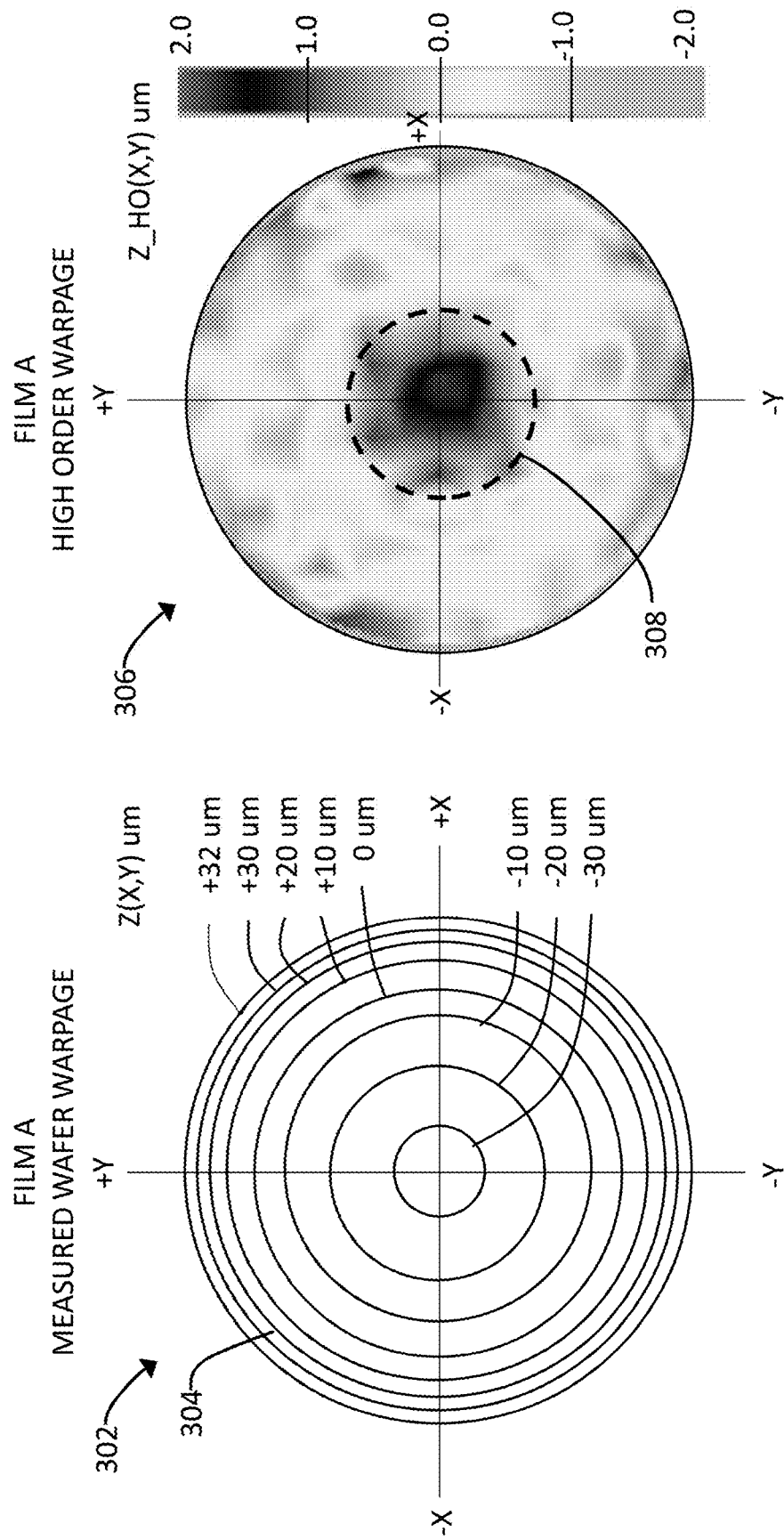
FIG. 3A is a contour plot of wafer warpage measurements Z(X,Y) over the semiconductor wafer due to deposited thin film A, the wafer warpage measurements Z(X,Y) determined in accordance with the embodiment of FIG. 1.
FIG. 3B is a grayscale map of high order warpage Z_HO(X,Y) due to deposited thin film A, the high order warpage Z_HO(X,Y) determined in accordance with the embodiment of FIG. 1.

FIG. 3A is a contour graph 302 of a set of net wafer warpage measurements Z(X,Y) of a semiconductor wafer 304 upon which a thin film A has been deposited. Wafer warpage due to thin film A is shown between −30 μm and +32 μm for a total range of 62 μm. Regions of a net wafer warpage of −30 μm and −20 μm were determined for a central portion of wafer 304. The wafer warpage measurements illustrated in FIG. 3A are representative of embodiments disclosed herein. In accordance with embodiments disclosed herein, wafer warpage measurements can vary and may be greater than or less than the wafer warpage measurements illustrated in FIG. 3A.

FIG. 3B is a grayscale map 306 of determined high order warpage Z_HO(X,Y) for the semiconductor wafer 304 after the thin film A deposited. In FIG. 3B, areas of semiconductor wafer 304 which have greater high order warpage are identified by the areas in FIG. 3B where the value of the high order warpage is larger, e.g., an area of semiconductor wafer 304 indicated to have a high order warpage for which the value is 2.0 has a greater high order warpage compared to an area of semiconductor wafer 304 indicated by a high order warpage for which the value is less than 2.0. In FIG. 3B, area 308 near the center of the wafer which has highest value of high order warpage.

Figure 3C:
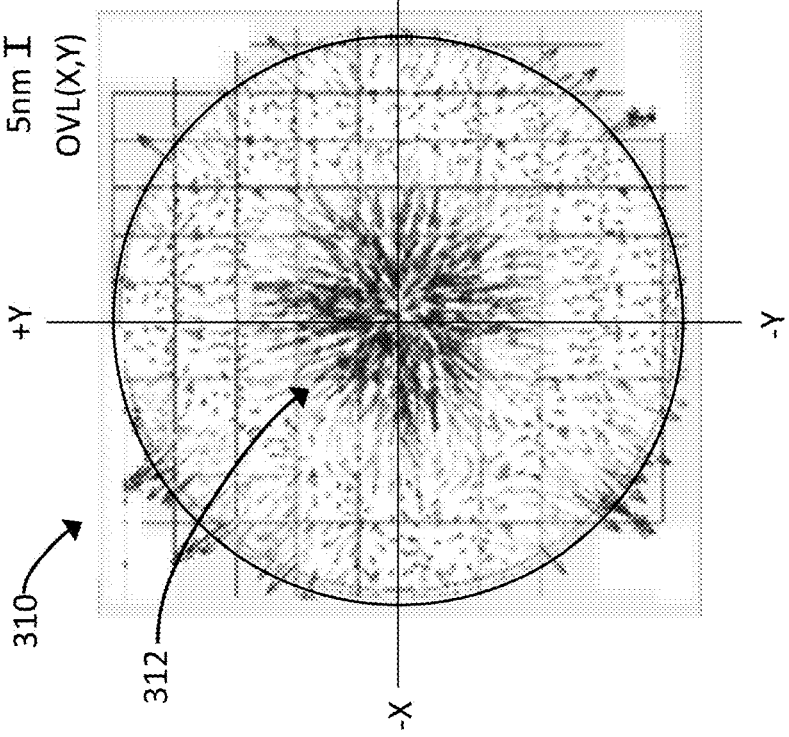
FIG. 3C is a plot of measured high order overlay residue OVL(X,Y) due to deposited thin film A, the measured high order overlay residue OVL(X,Y) having correlation with the high order warpage Z_HO(X,Y), determined in accordance with the embodiment of FIG. 1.

FIG. 3C is a vector graph 310 of measured high order overlay residue OVL(X,Y) for semiconductor wafer 304 after thin film A has been deposited. FIG. 3C shows an area 312 near the center of the semiconductor wafer has a large high order overlay residue OVL(X,Y) which correlates with the area 308 characterized by a larger high order warpage in FIG. 3B.

Figure 4A:
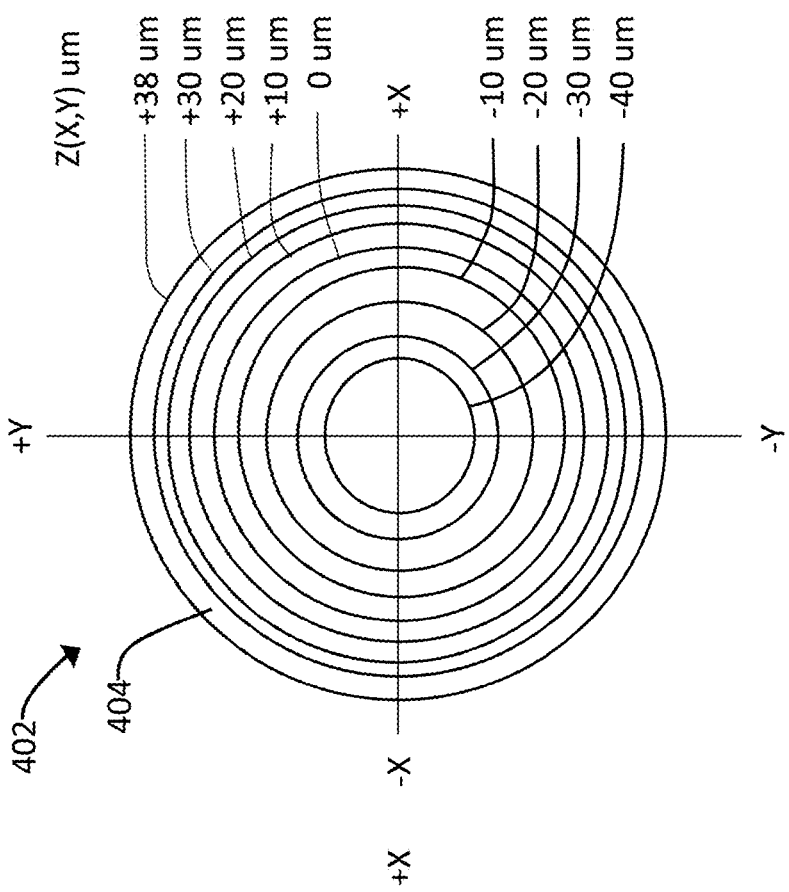
FIG. 4A is a contour plot of wafer warpage measurements Z(X,Y) over a semiconductor wafer due to deposited thin film B, the wafer warpage measurements Z(X,Y) determined in accordance with the embodiment of FIG. 1.

FIG. 4A is a contour graph 402 of the set of net wafer warpage measurements Z(X,Y) of a semiconductor wafer 404 upon which a thin film B has been deposited. Net wafer warpage due to thin film B is between −40 μm and +38 μm for a range of 78 μm.

Figure 4C:
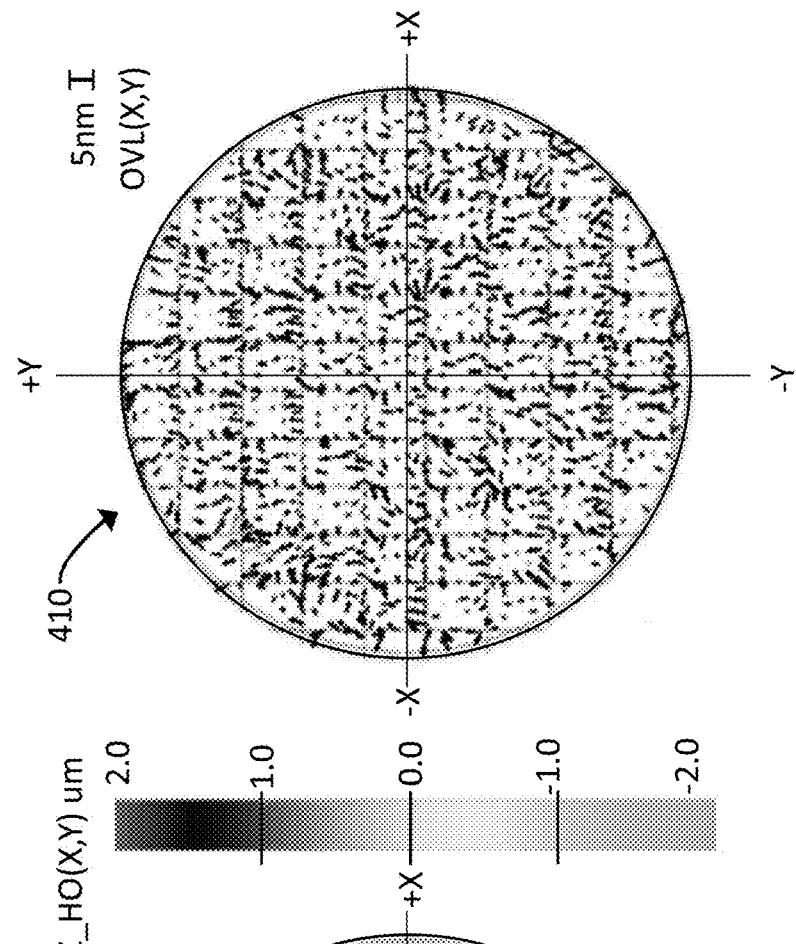
FIG. 4C is a plot of measured high order overlay residue OVL(X,Y) due to deposited thin film B, the measured high order overlay residue OVL(X,Y) having correlation with the high order warpage Z_HO(X,Y) determined in accordance with the embodiment of FIG. 1.
Figure 4B:
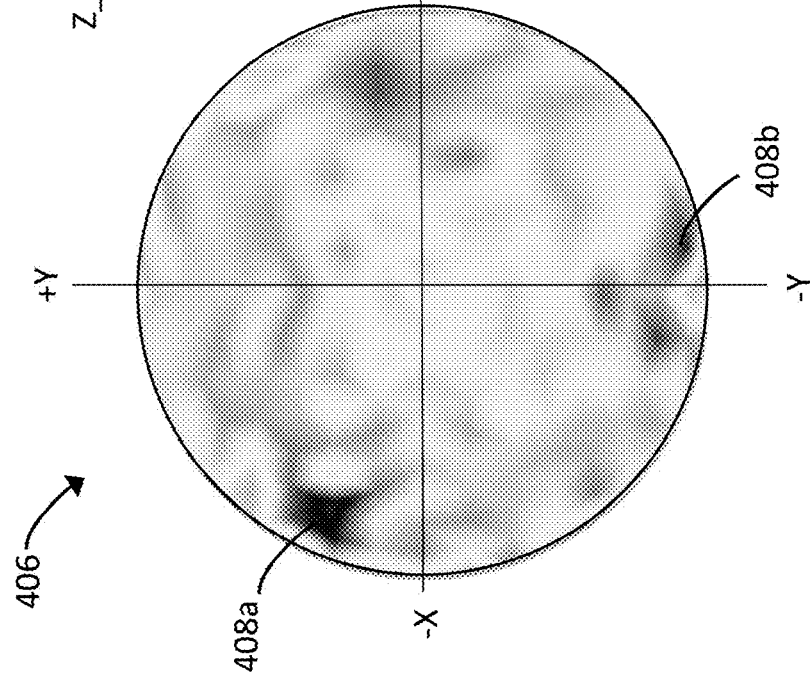
FIG. 4B is a grayscale map of high order warpage Z_HO(X,Y) due to deposited thin film B, the high order warpage Z_HO(X,Y) determined in accordance with the embodiment of FIG. 1.

FIG. 4B is a grayscale map 406 of determined high order warpage Z_HO(X,Y) for the semiconductor wafer 404 after a thin film B deposited. Areas 408a and 408b near the edge of semiconductor wafer 404 have the highest positive high order warpage.

FIG. 4C is a vector graph 410 of measured high order overlay residue OVL(X,Y) for semiconductor wafer 404 having thin film B deposited. Areas of high order OVL residue are apparent.

A visual comparison of net warpage measurements Z(X,Y) from FIGS. 3A and 4A suggests that the greater range of measured warpage of the wafer having thin film B might indicate a higher high order overlay residue OVL(X,Y) than that of the wafer having thin film A. However, a comparison of FIGS. 3C and 4C, indicates the actual measured overlay error was significantly higher with the wafer having thin film A. The determined high order wafer warpage Z_HO(X,Y) of FIG. 3B compared with FIG. 4B correlates well to the measured high order overlay residue OVL(X,Y) of FIGS. 3C and 4C.

In accordance with embodiments described herein, high order warpage threshold limits may be set by correlating wafer areas exceeding high order overlay specifications with the same areas of high order warpage. An example of this using a single dimension across a wafer to establish high and low limits of high order wafer warpage is described below.

Figure 5:
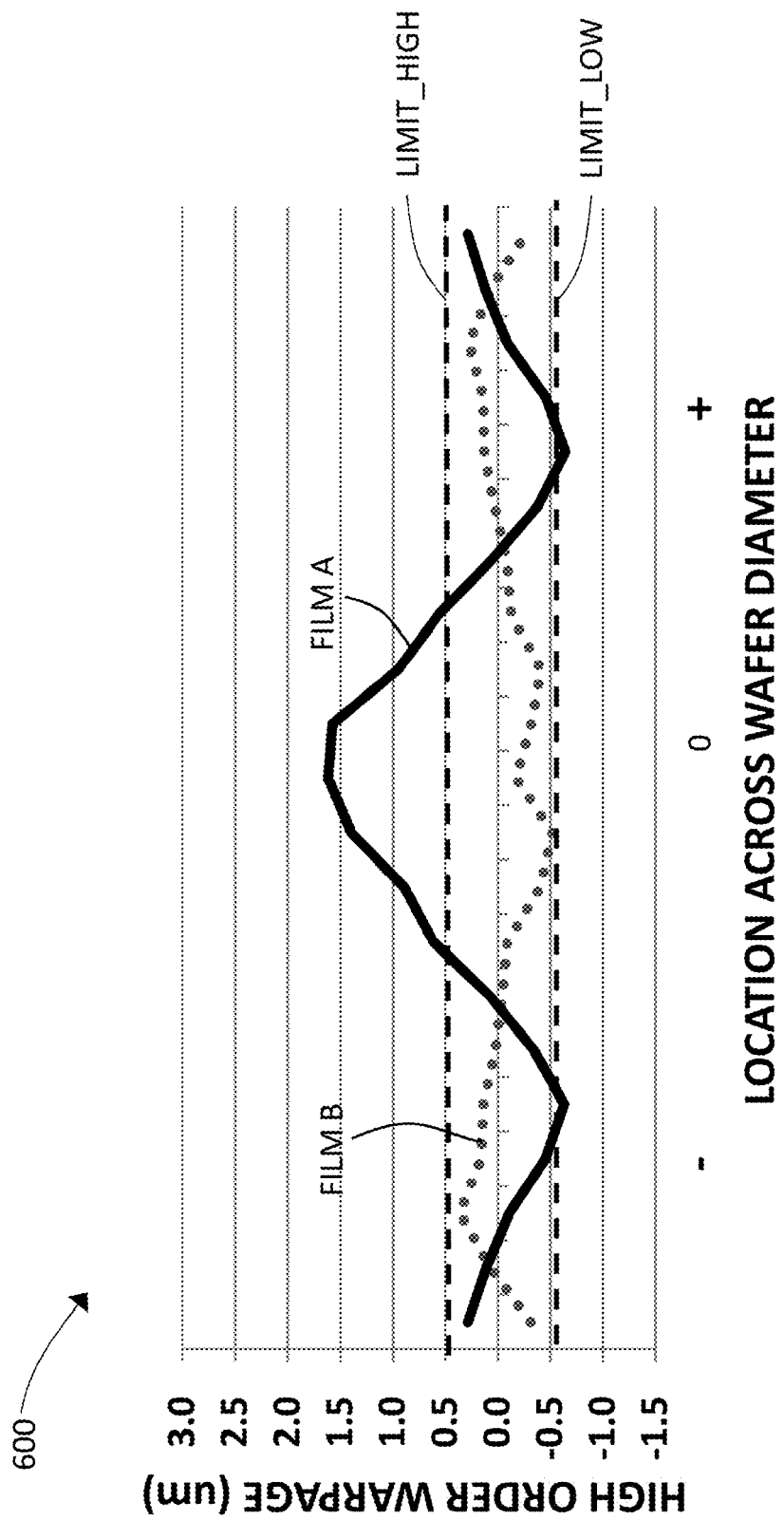
FIG. 5 is a graph of high order warpage Z_HO(X,Y) due to thin films A and B across a wafer diameter, the high order warpage Z_HO(X,Y) determined in accordance with the embodiment of FIG. 1.

FIG. 5 is a line graph 600 comparing a determined high order warpage across a diameter of semiconductor wafers 304 and 404 of FIGS. 3A (thin film A) and 4A (thin film B) respectively. An upper limit of high order warpage LIMIT_HIGH and a lower limit of high order warpage LIMIT_LOW, may be determined by comparing the measured high order warpage with measured high order overlay residues for each wafer. For example, it may be determined by a process metric such as wafer yield, that +/−5 nm defines a higher and lower limit of high order overlay residue. Using the method of FIG. 1, a high order warpage Z_HO(X,Y) may be determined and compared with a high order overlay residuals OVL(X,Y) measured for each wafer. This comparison may lead to a determination that the high order OVL residual of 5 nm corresponds to the high order wafer warpage of +/−0.5 μm. Limits for the high order wafer warpage LIMIT_HIGH and LIMIT_LOW may be set at +0.5 μm and −0.5 μm respectively to produce thin films having high order overlay residuals less than 5 nm. High order wafer warpage limits LIMIT_HIGH and LIMIT_LOW may be used for managing modifications of the process parameters used in the thin film deposition in a timely manner. For example, process parameters including deposition time, deposition rate, chamber pressure and chemical ratios may be modified for following wafers to be processed, enhancing the wafer yield for those wafers. By controlling high order warpage Z_HO(X,Y) to be within the limits LIMIT_HIGH and LIMIT_LOW, the high order OVL residual is kept under control (within its limits) which leads to improved wafer yield.

In accordance with embodiments described herein, other techniques for determining limits on high order warpage may include examination of the wafer area and comparing areas of high order overlay residue OVL(X,Y) that exceed the process limit with the same areas for high order wafer warpage. A scatter plot of high order overlay residue OVL(X,Y) vs high order wafer warpage Z_HO(X,Y) pairs may be correlated. Comparisons of high order warpage Z_HO(X,Y) and high order overly residue OVL(X,Y) may be made for multiple wafers. Comparisons may be ongoing, updating the high order warpage limits, LIMIT_HIGH and LIMIT_LOW as needed.

In accordance with embodiments described herein, peeling events or peeling defects in formed thin films are correlated to high order warpage Z_HO(X,Y) and the results used to modify parameters at which the thin film deposition process is carried out so as to manage the formation of such peeling events. A peeling event occurs when a portion of a thin film detaches, or "peels", from the substrate the thin film was deposited on. A peeling event may be caused by high order stress in the thin film.

FIGS. 6A-7C are examples of semiconductor wafers having a thin film deposited thereon. Comparisons between the high order warpage determined according to the method of FIG. 1 and peeling events, demonstrate a correlation in accordance with disclosed embodiments. Wafer warpage measurements before and after thin film deposition were made using an interferometer directed to a side of the semiconductor wafer on which the thin film is to be or was deposited.

Figure 6B:
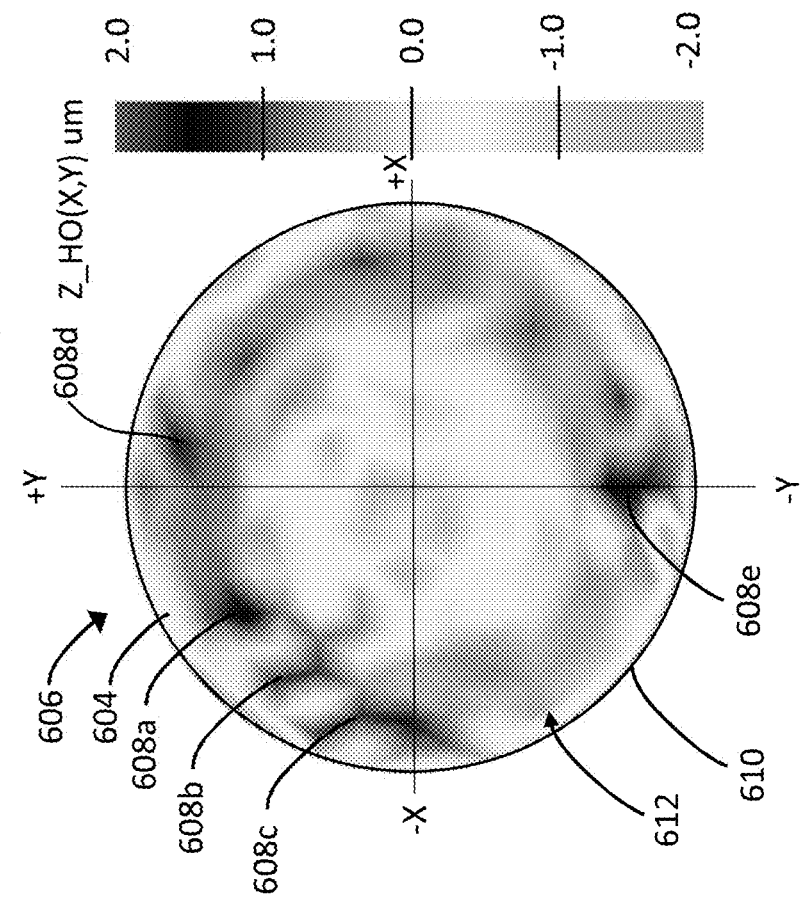
FIG. 6B is a grayscale map of high order warpage Z_HO(X,Y) due to deposited thin film C, the high order warpage Z_HO(X,Y) determined in accordance with the embodiment of FIG. 1.
Figure 6A:
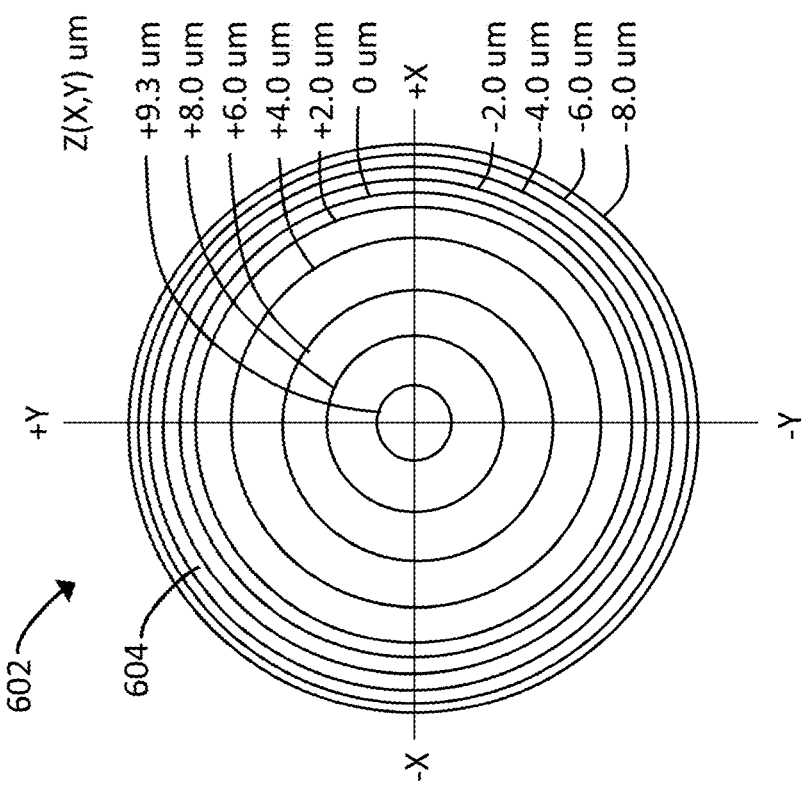
FIG. 6A is a contour plot of warpage measurements Z(X,Y) over a semiconductor wafer due to deposited thin film C, the warpage Z(X, Y) determined in accordance with the embodiment of FIG. 1.

FIG. 6A is a contour graph 602 of the set of net wafer warpage measurements Z(X,Y) of a semiconductor wafer 604 upon which a thin film C has been deposited. The set of net wafer warpage measurements Z(X, Y) due to thin film C is between −8.0 μm and +9.3 μm for a range of 17.3 μm.

FIG. 6B is a grayscale map 606 of determined high order warpage Z_HO(X,Y) for the semiconductor wafer 604 after the thin film C has been deposited. In FIG. 6B, areas of semiconductor wafer 604 which have greater high order warpage are identified by the areas in FIG. 6B where the value of the high order warpage is larger, e.g., an area of semiconductor wafer 304 indicated to have a high order warpage for which the value is 2.0 has a greater high order warpage compared to an area of semiconductor wafer 304 indicated by a high order warpage for which the value is less than 2.0. In FIG. 6B, areas 608a-e near an outer perimeter 610 of the semiconductor wafer 604 have the highest positive high order warpage. A ring of positive high order wafer warpage 612 circles the entire semiconductor wafer 604.

Figure 6C:
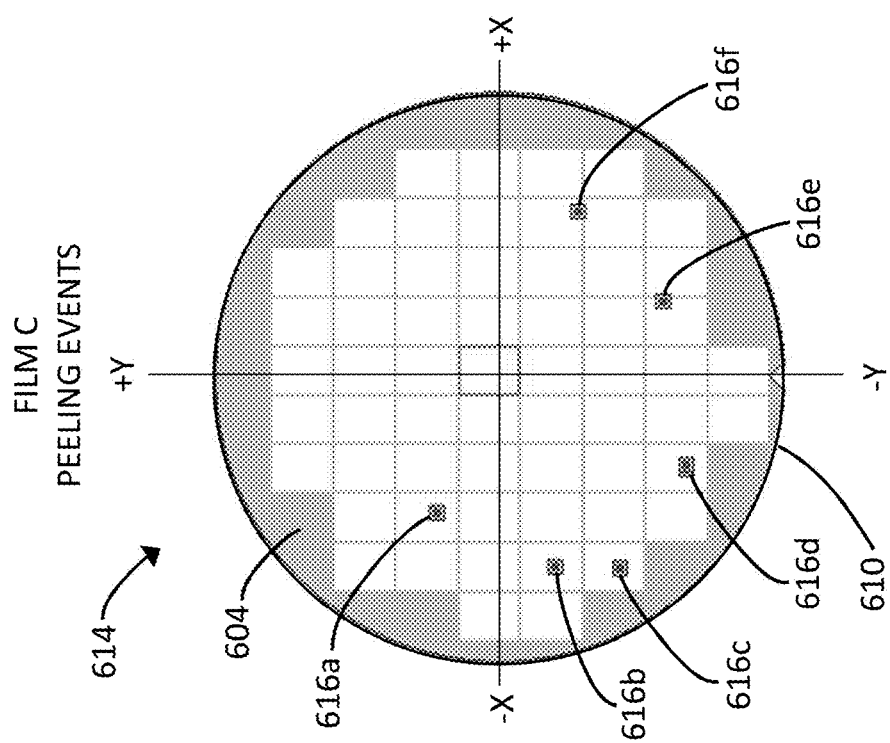
FIG. 6C is a plot of observed peeling events due to deposited thin film C, the peeling events having correlation to high order warpage Z_HO(X,Y) determined in accordance with the embodiment of FIG. 1.

FIG. 6C is a peeling event plot 614. Peeling event 616a-f are shown following an outer perimeter of the semiconductor wafer 604 correlating with the ring of positive high order wafer warpage 612 of FIG. 6B.

Figure 7A:
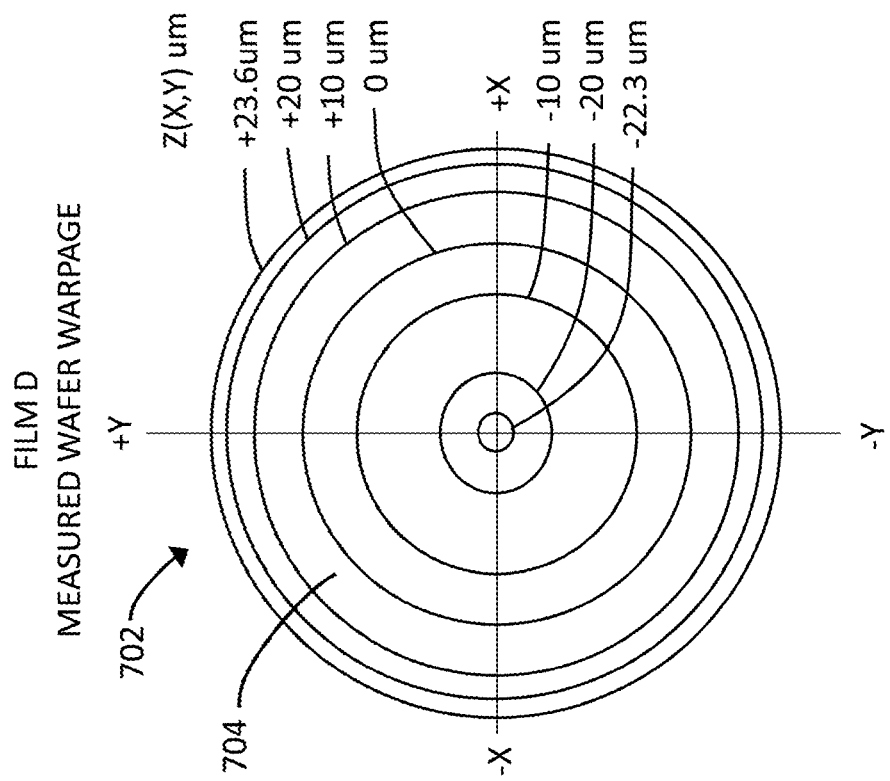
FIG. 7A is a contour plot of wafer warpage measurements Z(X,Y) over a semiconductor wafer due to deposited thin film D, the wafer warpage measurements Z(X,Y) determined in accordance with the embodiment of FIG. 1.

FIG. 7A is a contour graph 702 of the set of net wafer warpage measurements Z(X,Y) of a semiconductor wafer 704 upon which a thin film D has been deposited. The set of net wafer warpage measurements Z(X,Y) due to thin film D is between −22.3 μm and +23.6 μm for a range of 45.9 μm, which is more than double the range of the set of net wafer warpage measurements Z(X, Y) of wafer 604 of FIG. 6A.

Figure 7C:
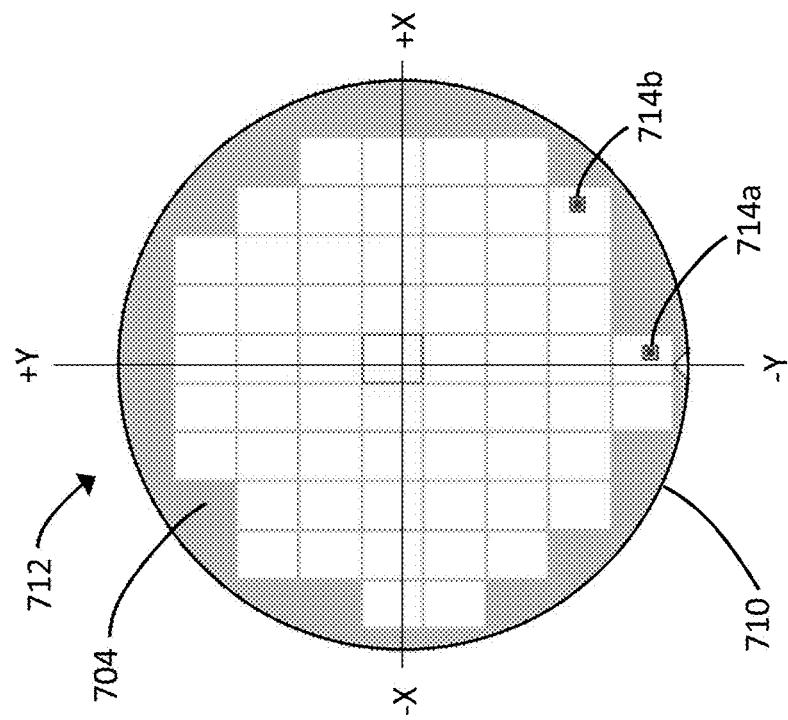
FIG. 7C is a plot of observed peeling events due to deposited thin film D, the peeling events having correlation to high order warpage Z_HO(X,Y) determined in accordance with the embodiment of FIG. 1.
Figure 7B:
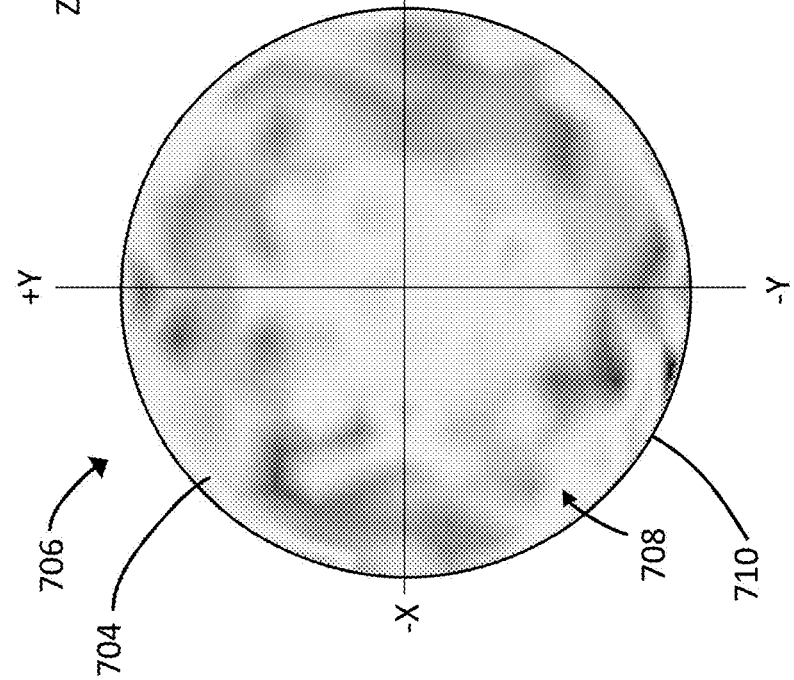
FIG. 7B is a grayscale map of high order warpage Z_HO(X,Y) due to deposited thin film D, the high order warpage Z_HO(X,Y) determined in accordance with the embodiment of FIG. 1.

FIG. 7B is a grayscale map 706 of determined high order warpage Z_HO(X,Y) for the semiconductor wafer 704 after the thin film D has been deposited. In FIG. 7B, a diffuse positive high order ring 708 is present near an outer perimeter 710 of the semiconductor wafer 704. The diffuse high order ring 708 is less pronounced than the high order ring 612 of FIG. 6B. The map 706 of FIG. 7B does not have the high positive high order warpage areas such as areas 608a-e of FIG. 6B.

FIG. 7C is a peeling event plot 712 for semiconductor wafer 704 after thin film D was deposited. Two peeling events 714a and 714b are shown following an outer perimeter 710 of the semiconductor wafer 704. The lower number of peeling events compared to FIG. 6C plus the placement of the peeling events 714a and 714b near the outer perimeter 710 correlate with the more diffuse positive high order ring 708 and the lower high order warpage Z_HO(X,Y).

Figure 8:
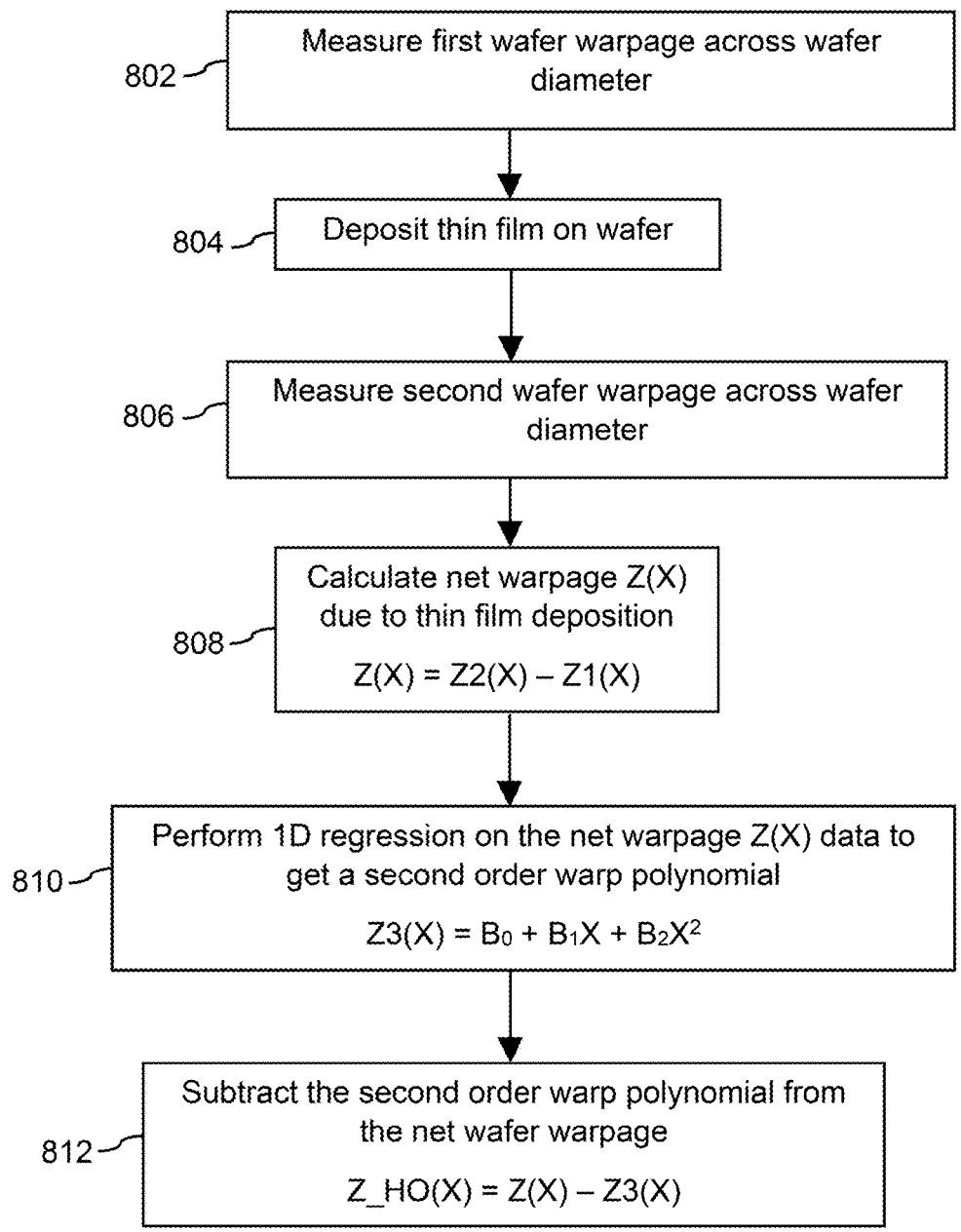
FIG. 8 is a flowchart of a method, according an alternate embodiment, to determine a high order warpage Z_HO(X) across a diameter of the semiconductor wafer.

In an embodiment a method for estimating overlay residues, caused by high order, or non-uniform film stress, using quick measurements of semiconductor wafer warpage, due to thin film deposition, will be described. FIG. 8 is a method 800 for determining a high order warpage Z_HO(X) across a diameter of a semiconductor wafer. The high order warpage Z_HO(X) may be correlated to overlay residues across the semiconductor wafer.

In a first step 802, prior to a thin film deposition, a first set of warpage measurements Z1(X) are taken across a semiconductor wafer diameter using a warpage measurement device. The first set of warpage measurements Z1(X) are taken utilizing a first surface of the semiconductor wafer onto which a thin film is to be subsequently deposited.

In step 804, the thin film is deposited onto the first surface of the semiconductor wafer.

In step 806, following the deposition of the thin film, a second set of warpage measurements Z2(X) is taken across the semiconductor diameter using the warpage measurement device. A surface of the thin film opposite the first surface of the semiconductor wafer may be used for the second warpage measurements.

In step 808, a warpage due to thin film deposition Z(X) is determined by subtracting the first set of warpage measurements Z1(X) from the second set of warpage measurements Z2(X) for each measurement point X across the semiconductor wafer diameter.

$$Z(X)=Z2(X)-Z1(X)$$

In step 810, a one dimensional polynomial regression is performed on the warpage measurements Z(X) to create a second order polynomial Z3(X) as a function of a coordinate X.

$$Z3(X)=B_0+B_1X+B_2X^2$$

Various computer numerical analysis tools are available to perform a one dimensional regression resulting in coefficients $B_0$, $B_1$ and $B_2$. As with other regressions, the resultant polynomial may be plotted across the X range for which the first and second set of warpage measurements Z1(X) and Z2(X) were taken, to check that the regression algorithm did not result in unusually large deviations from the measured warpage within the X and Y ranges. Adjustment of regression criteria specific to the numerical analysis tool may be needed to reduce unusually large deviations from the measured warpage within the X range.

In step 812, a high order wafer warpage Z_HO(X) is determined by subtracting the $2^{nd}$ order polynomial Z3(X) from the wafer warpage measurement Z(X, Y) for each measurement location X along the diameter of the semiconductor wafer.

$$Z\_HO(X)=Z(X)-Z3(X)$$

Comparisons of high order warpage Z_HO(X) with measured OVL residue over the same diameter of the semiconductor wafer may be performed to determine appropriate limits as has been previously described.

Figure 9:
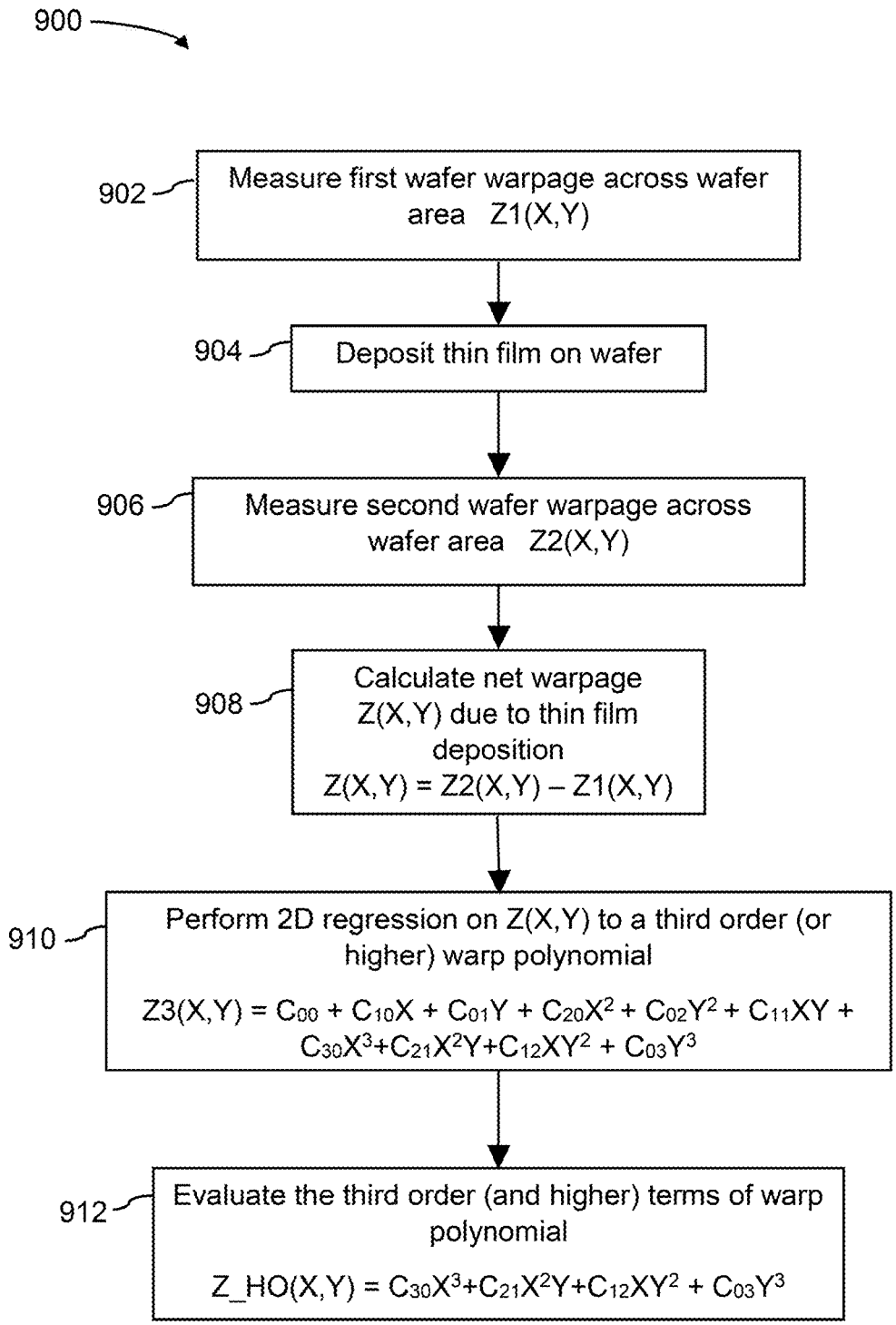
FIG. 9 is a flowchart of a method, according to an alternate embodiment, to determine a high order warpage Z_HO(X) across a diameter of the semiconductor wafer.

FIG. 9 is an alternate process 900 in accordance with embodiments described herein for determining a high order warpage Z_HO(X,Y) for a semiconductor wafer. Step 902 is to measure a first, or pre-deposition, set of wafer warpage Z1(X,Y) across a wafer area. Step 904 is to deposit a thin film on the semiconductor wafer. Step 906 is to measure a second, or post-deposition, set of wafer warpage Z2(X,Y) across the wafer area. Step 908 is to determine a set of net wafer warpage Z(X,Y) across the wafer area. Step 910 is to perform a two dimensional (X and Y dimensions) regression on the set of net wafer warpage Z(X, Y) data to determine a third order, or higher order, warp polynomial Z3(X,Y). Step 912 determines the high order warpage Z_HO(X,Y) of the semiconductor wafer by evaluating the third order and higher (if higher order polynomial has been determined) terms of the warp polynomial Z3(X,Y).

Fine wafer alignment is an alternate measurement technique to be used as a basis for determining a high order stress in a thin film. Fine wafer alignment uses fine wafer alignment marks created prior to depositing a thin film on a substrate. After the thin film is deposited, the wafer is place in a lithography tool and aligned to a reticle having corresponding fine wafer alignment marks under the thin film. Fine wafer alignment is faster than overlay residue measurement because fine wafer alignment can be performed without a succeeding photoresist being deposited and patterned.

Figure 10:
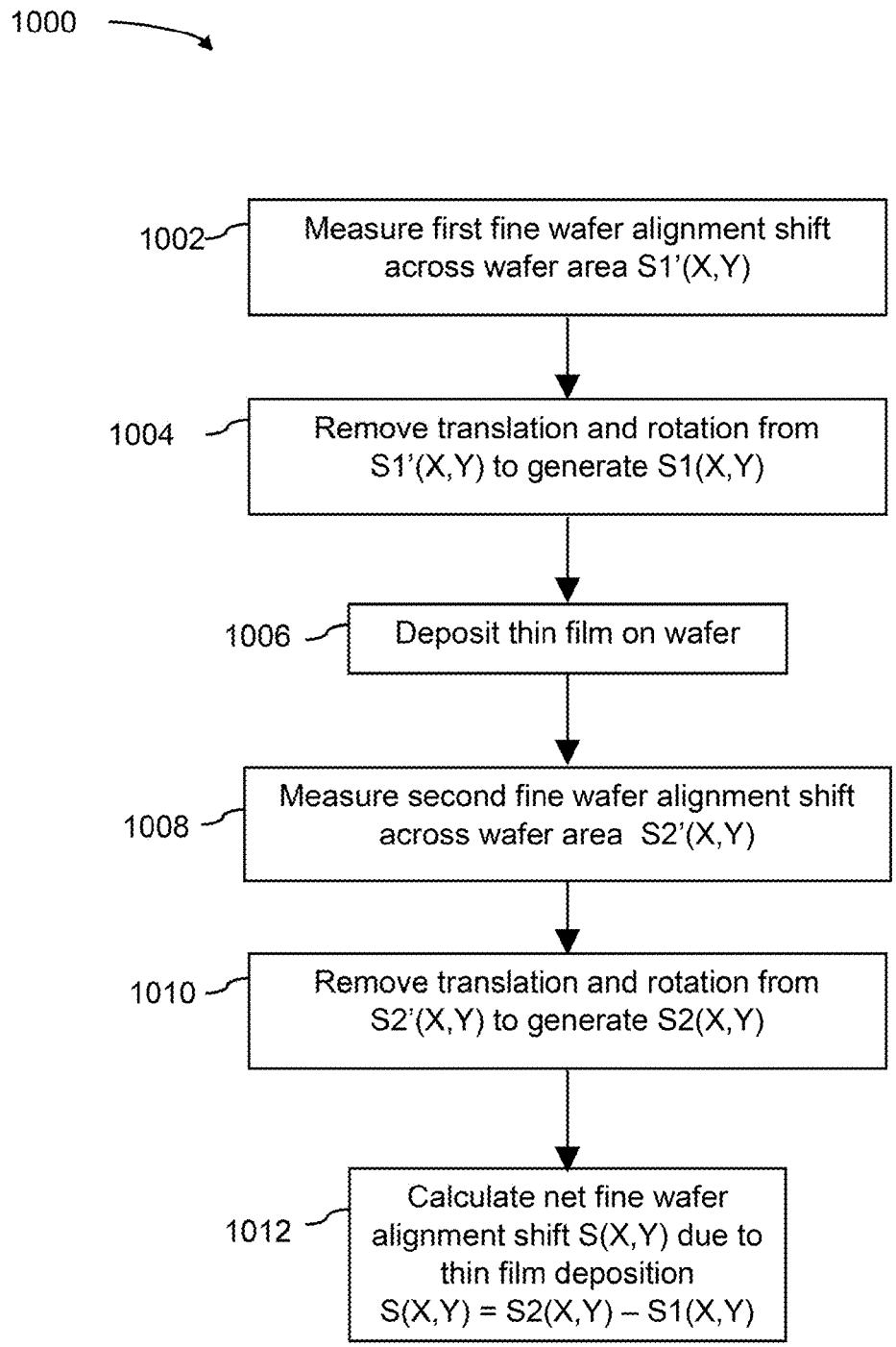
FIG. 10 is a flowchart of a method, according to an alternate embodiment, to determine a high order stress in a thin film utilizing fine wafer alignment, removing translation and rotation.

FIG. 10 is an alternate method 1000, using fine wafer alignment and removing translation and rotation to determine a high order stress in a thin film. Step 1002 includes measuring a first raw fine wafer alignment shift S1'(X,Y) at measurement locations across a semiconductor wafer area. Step 1004 includes translation, expansion and rotation being removed from the first raw fine wafer alignment shift S1'(X,Y) to determine the fine wafer alignment shift S1(X,Y). The translation and rotation removal may be done by the lithography tool or mathematically after the first raw fine wafer alignment shift S1'(X,Y) has been measured.

Step 1006 includes depositing the thin film onto the wafer. Step 1008 includes measuring a second raw fine wafer alignment shift S2'(X,Y) across the semiconductor wafer area. Step 1010 removes translation and rotation from the second raw fine wafer alignment shift S2'(X,Y) to determine the fine wafer alignment shift S2(X,Y).

Step 1012 includes determining the net fine wafer alignment shift S(X,Y) due to thin film deposition be subtracting the first fine wafer alignment shift S1(X,Y) from the second fine wafer alignment shift S2(X,Y).

$$S(X,Y)=S2(X,Y)-S1(X,Y)$$

With the filter and rotation terms removed, the non-uniform stress may be determined with greater certainty at the center of the semiconductor wafer surface because the fine wafer alignment error is generally small to the center of the wafer.

Figure 11:
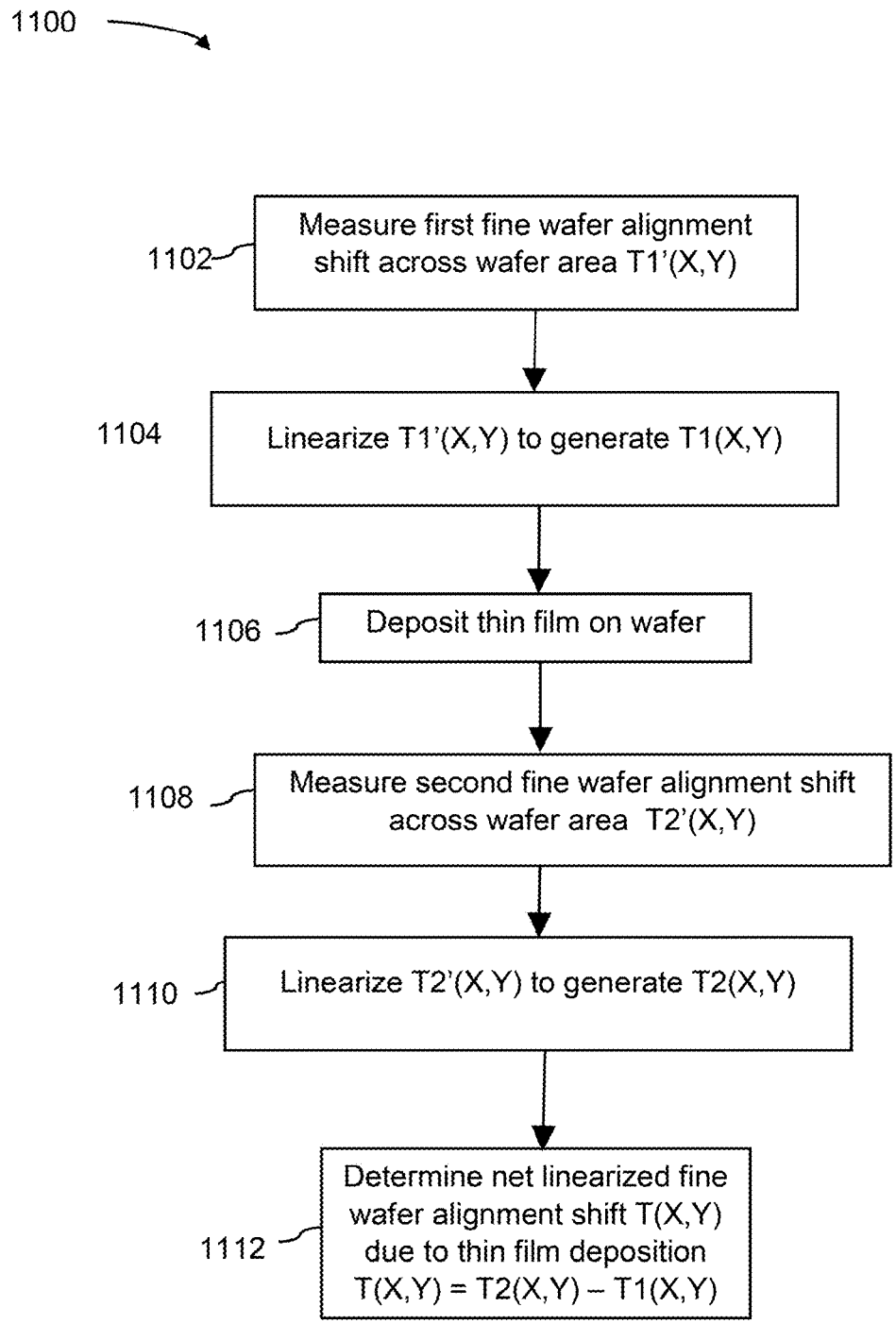
FIG. 11 is a flowchart of a method, according to an alternate embodiment, to determine a high order stress in a thin film utilizing fine wafer alignment (FIWA) and linear modeling.

FIG. 11 is an alternate method 1100, using fine wafer alignment and a linear model of the FIWA error. Step 1102 includes measurement of a first fine wafer alignment shift T1'(X,Y) across a semiconductor wafer area. Step 1104 includes making a linear model T1(X,Y) of the first fine wafer alignment shift T1'(X,Y) removing translation, expansion and rotation terms. Step 1106 includes depositing a thin film on the semiconductor wafer surface. Step 1108 includes measuring a second fine wafer alignment shift T2'(X,Y) across the semiconductor wafer. Step 1110 includes making a linear model T2(X,Y) of the second fine wafer alignment shift T2'(X,Y). Step 1112 includes determining a net linear fine wafer alignment shift T(X,Y) due to thin film deposition by subtracting the linear model T1(X,Y) from the linear model T2(X,Y).

$$T(X,Y)=T2(X,Y)-T1(X,Y)$$

FIGS. 12A-12C and 13A-13C are graphs made in accordance with the method 1000 of FIG. 10 to determine non-linear stress in a deposited thin film.

Figure 12A:
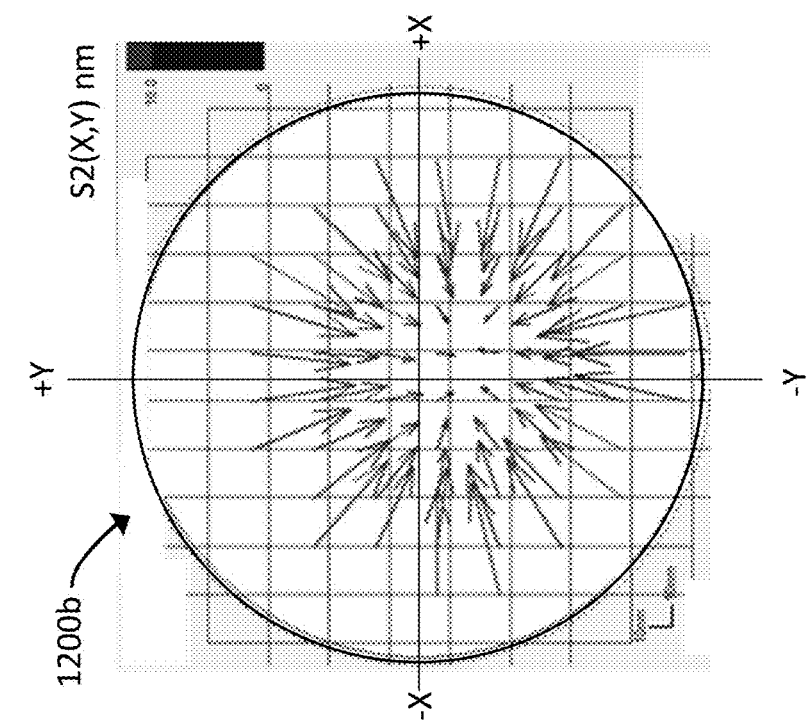
FIGS. 12A-12C are FIWA wafer maps illustrating use of the method of FIG. 10 to determine high order stress in a thin film E.
Figure 12B:
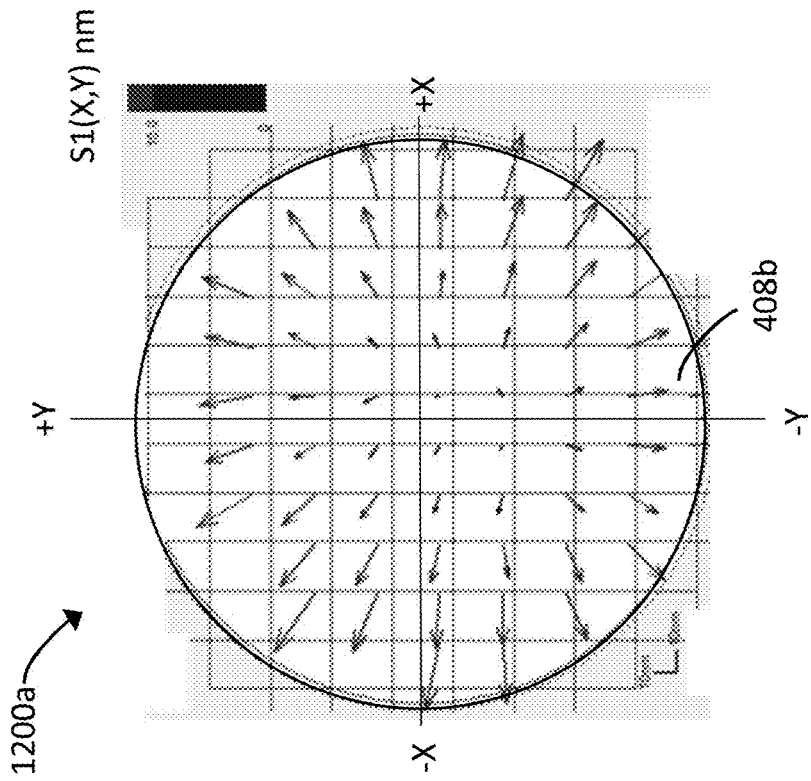
Figure 12C:
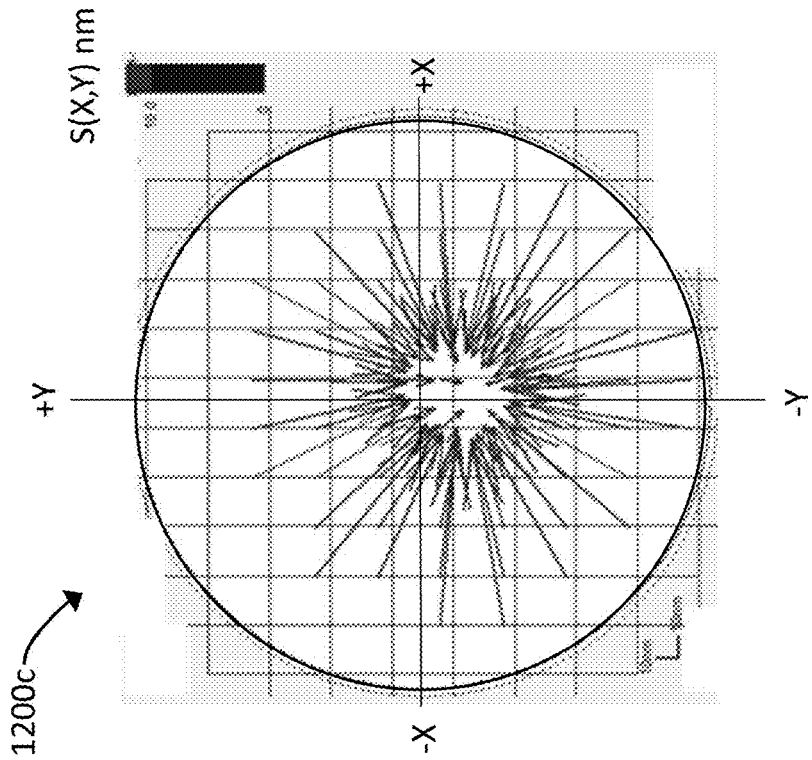

FIGS. 12A-12C illustrate a thin film E having a high non-linear stress. FIG. 12A is a graph 1200a showing a first FIWA shift S1(X,Y) before deposition of thin film E. FIG. 12B is a graph 1200b showing a second FIWA shift S2(X,Y) after deposition of thin film E. Translation, expansion and rotation have been removed in graphs 1200a and 1200b. FIG. 12C is graph 1200c showing a net FIWA shift S(X,Y) due to film deposition.

Figure 13A:
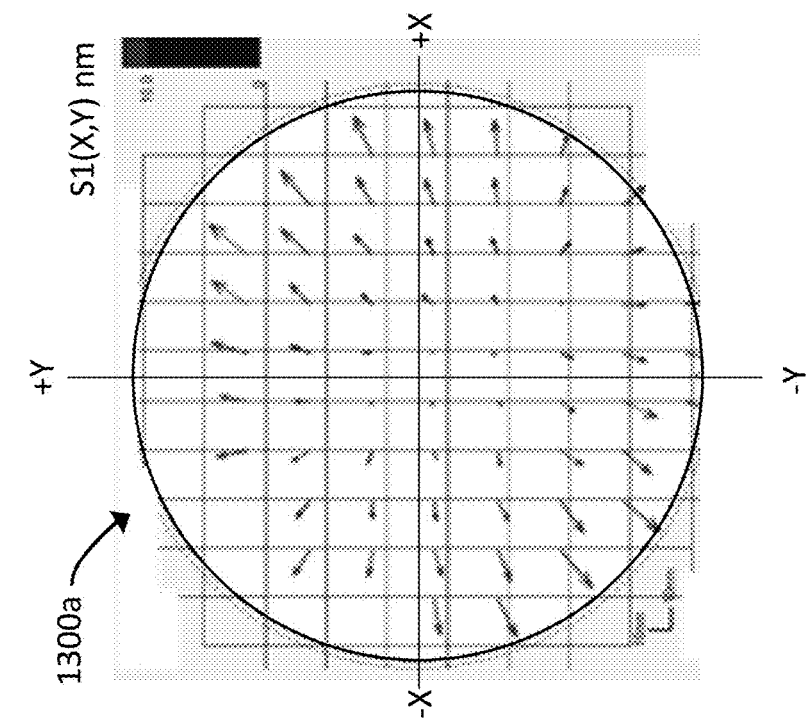

FIGS. 13A-13C illustrate a thin film F having a low non-linear stress. FIG. 13A is a graph 1300a showing a first FIWA shift S1(X,Y) before deposition of thin film F. FIG. 13B is a graph 1300b showing a second FIWA shift S2(X,Y) after deposition of thin film F. Translation and rotations have been removed in graphs 1300a and 1300b. FIG. 13C is graph 1300c showing a net FIWA shift S(X,Y) due to film deposition.

FIGS. 14A-14C and 15A-15C are graphs made in accordance with the method 1100 of FIG. 11 to determine non-linear stress in a deposited thin film.

Figure 14B:
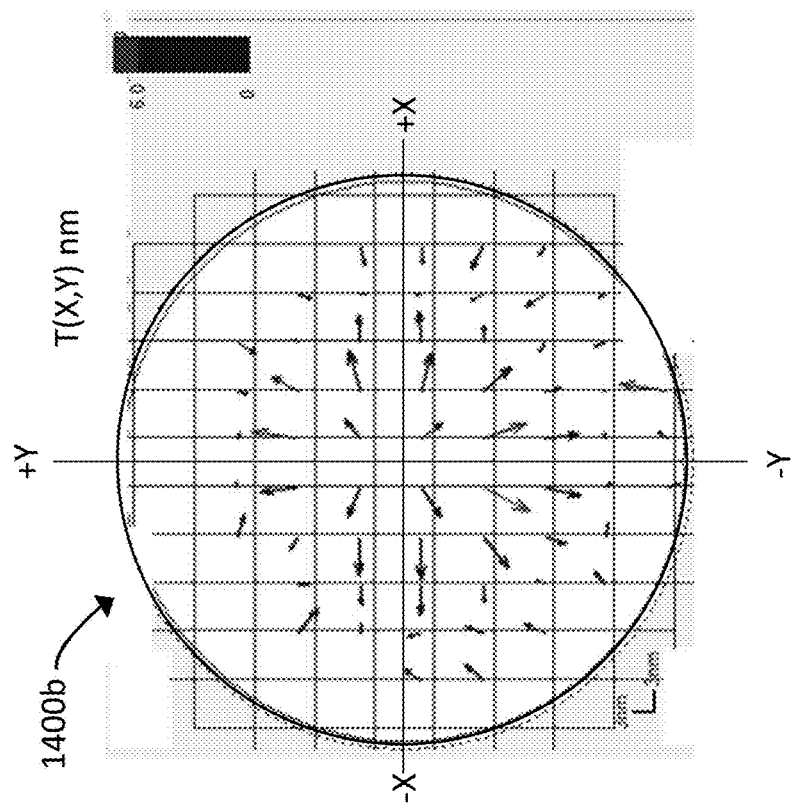
FIGS. 14A-14C are wafer maps illustrating use of the method of FIG. 11 to determine high order stress in a thin film G.
Figure 14A:
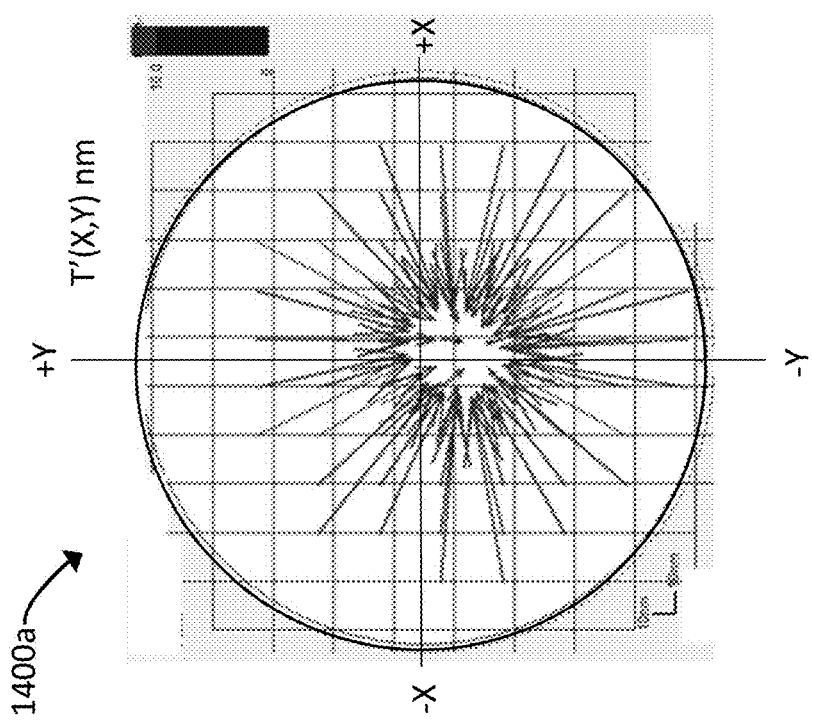
Figure 14C:
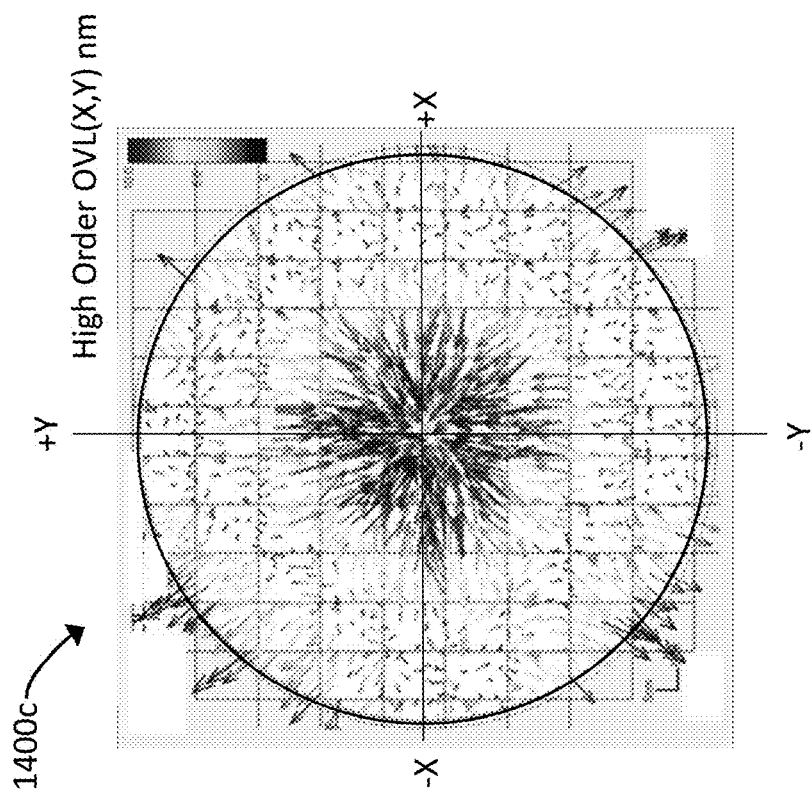

FIGS. 14A-14C illustrate a thin film G having a high non-linear stress. FIG. 14A is a graph 1400a showing an FIWA shift T'(X,Y) due to deposition of thin film G. FIG. 14B is a graph 1400b showing a linear model T(X, Y) of FIWA shift T'(X,Y). Translation and rotations have been removed in graphs 1400a and 1400b. FIG. 14C is a graph 1400c showing a high order OVL residue OVL(X,Y). Correlation between the FIWA linear model T(X,Y) and the high order OVL residue OVL(X,Y) may be observed.

Figure 15A:
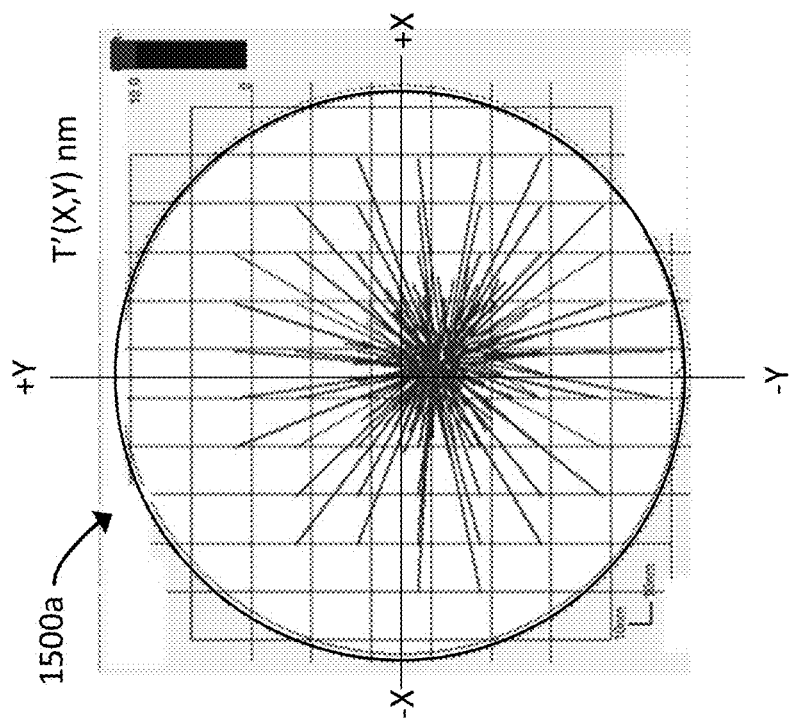
FIGS. 15A-15C are wafer maps illustrating use of the method of FIG. 11 to determine high order stress in a thin film H.
Figure 15C:
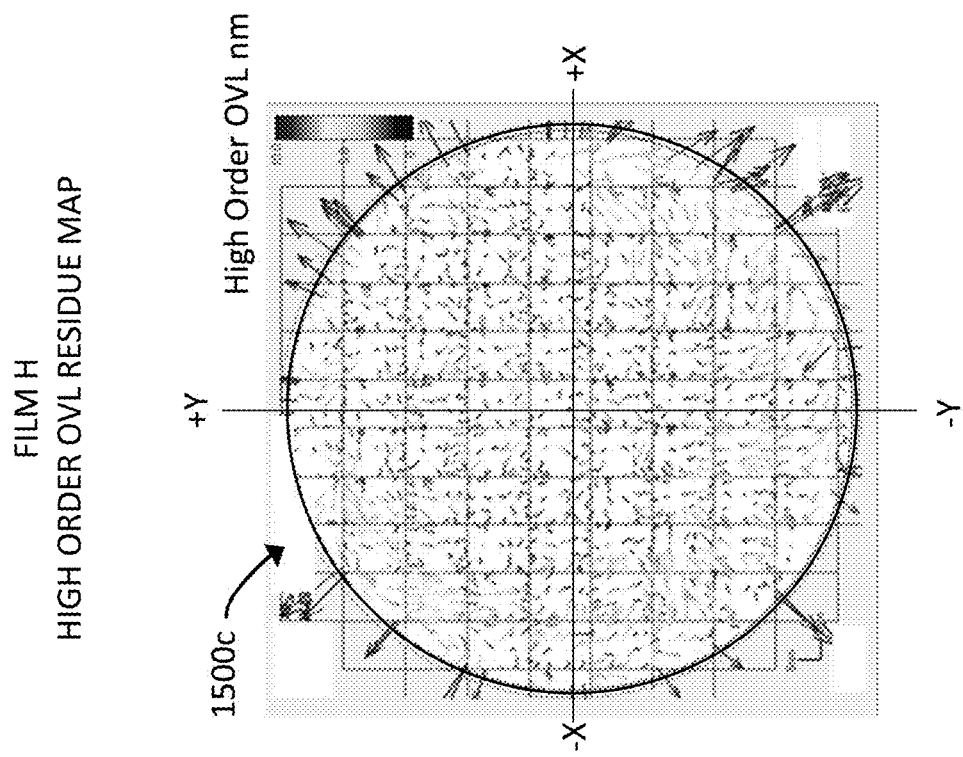
Figure 15B:
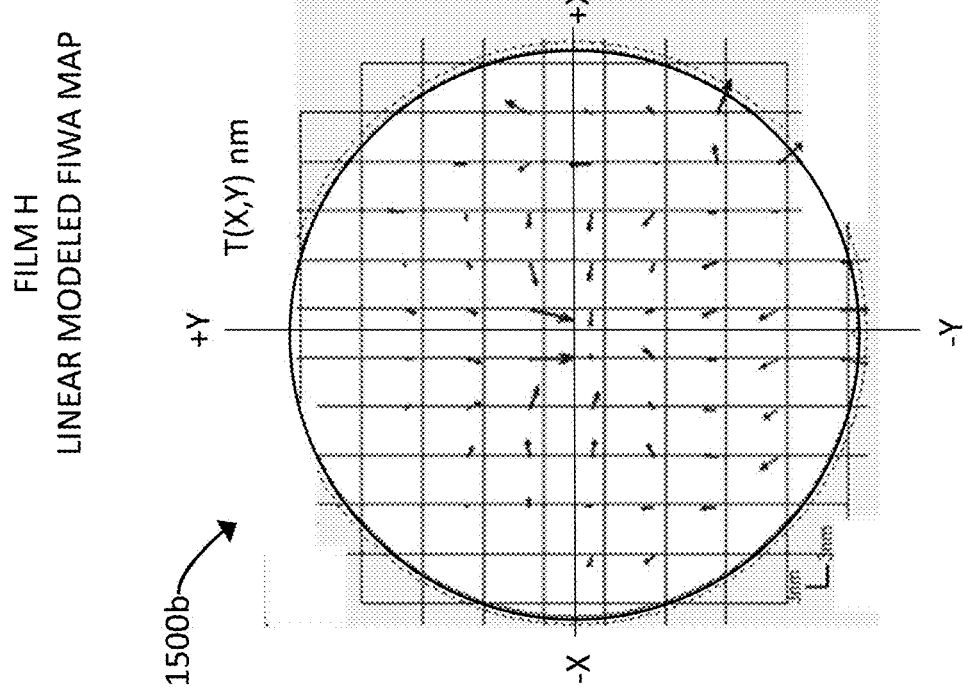

FIGS. 15A-15C illustrate a thin film H having a low non-linear stress. FIG. 15A is a graph 1500a showing an FIWA shift T'(X,Y) due to deposition of thin film H. FIG. 15B is a graph 1500b showing a linear model T(X,Y) of FIWA shift T'(X,Y). Translation and rotations have been removed in graphs 1500a and 1500b. FIG. 15C is a graph 1500c showing a high order OVL residue OVL(X,Y). Correlation between the FIWA linear model T(X,Y) and the high order OVL residue OVL(X,Y) may be observed.

In an embodiment, a method for determining high order overlay residue includes depositing a thin film on a surface of a substrate, measuring a warpage of the substrate after the thin film deposition at a plurality of measurement locations on the surface of the substrate. A warpage of the substrate due to the thin film deposition at a plurality of measurement locations on the surface of the substrate may be determined. The determined warpage measurements of the substrate due to the thin film deposition may be fit to a low order polynomial as a function of coordinates of the plurality of measurement locations on the surface of the substrate. The low order polynomial may be evaluated for at least one coordinate of a measurement location. The evaluated low order polynomial for the at least one coordinate of a measurement location may be subtracted from the warpage measurement of the substrate after the thin film deposition at the measurement location.

In an embodiment, a method for evaluating high order stress in a thin film deposited upon a semiconductor wafer, includes determining a low order wafer warpage as a function of location on the semiconductor wafer using warpage measurements from a plurality of locations on the semiconductor wafer. A high order warpage may be determined as a function of location using the warpage measurements from the plurality of locations on the semiconductor wafer and the determined low order warpage. A plurality of high order overlay errors may be measured utilizing a plurality of overlay patterns across the semiconductor wafer.

In an embodiment, a method, including measuring a warpage of a semiconductor wafer in a direction substantially normal to a surface of the semiconductor wafer at a plurality of locations on the surface of the semiconductor wafer, the plurality of locations identified using a coordinate axes substantially parallel to the surface of the semiconductor wafer. A regression polynomial may be generated as a function of at least one of the coordinate axes substantially parallel to the surface of the semiconductor wafer and the warpage measurements at the plurality of locations on the surface of the semiconductor wafer. A high order polynomial may be generated by removing low order elements of the regression polynomial. The high order polynomial may be evaluated for a location on the semiconductor wafer surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for evaluating high order stress in a thin film deposited upon a semiconductor wafer, comprising:
   determine a low order wafer warpage as a function of location on the semiconductor wafer using warpage measurements from a plurality of locations on the semiconductor wafer;
   determine high order warpage as a function of location using the warpage measurements from the plurality of locations on the semiconductor wafer and the determined low order warpage; and
   measure a plurality of high order overlay errors utilizing a plurality of overlay patterns across the semiconductor wafer.

2. The method of claim 1, further comprising:
   comparing the determined high order warpage at each of the plurality of locations on the semiconductor wafer to the overlay error measured nearest each of the plurality of locations; and
   determining a threshold for high order warpage when the overlay error at the plurality of locations exceeds an overlay error threshold.

3. The method of claim 2, wherein the overlay error at the plurality of locations is a magnitude.

4. The method of claim 2, wherein the high order overlay error threshold includes:
   an upper threshold; and
   a lower threshold.

5. The method of claim 4, wherein the threshold for high order warpage includes:
   an upper threshold; and
   a lower threshold.

6. The method of claim 5, further comprising determining a change in a parameter affecting a process used to deposit the thin film is necessary when the high order warpage is above the high order warpage threshold or below the high order warpage threshold.

7. A method, comprising:
   measuring a warpage of a semiconductor wafer in a direction substantially normal to a surface of the semiconductor wafer at a plurality of locations on the surface of the semiconductor wafer, the plurality of locations identified using a coordinate axes substantially parallel to the surface of the semiconductor wafer;
   generating a regression polynomial as a function of at least one of the coordinate axes substantially parallel to the surface of the semiconductor wafer and the warpage measurements at the plurality of locations on the surface of the semiconductor wafer, wherein the regression polynomial has at least a third order;
   generating a high order polynomial by removing low order elements of the regression polynomial;
   evaluating the high order polynomial for a location on the semiconductor wafer surface; and
   determining a warpage of the semiconductor wafer due to the deposition of the thin film at the plurality of locations by subtracting the measured first warpage at the plurality of locations from the measured second warpage at the plurality of locations.

8. The method of claim 7, wherein the low order elements of the regression polynomial which are removed in the generating step are of second order and less.

9. The method of claim 7, further comprising depositing a thin film on the surface of the semiconductor wafer, wherein the measuring a warpage of a semiconductor wafer in a direction substantially normal to a surface of the semiconductor wafer surface at a plurality of locations on the surface of the semiconductor wafer includes:
   prior to depositing the thin film on the surface of the semiconductor wafer, measuring a first warpage of the semiconductor wafer at the plurality of locations on the surface of the semiconductor wafer; and
   after depositing the thin film on the surface of the semiconductor wafer, measuring a second warpage of the semiconductor wafer at the plurality of locations on the surface of the semiconductor wafer.

10. The method of claim 7, further comprising comparing the determined warpage of the semiconductor wafer due to the deposition of the thin film to a high order warpage upper threshold and a high order warpage lower threshold.

11. The method of claim 10, further comprising:
   determining the high order warpage upper threshold and the high order warpage lower threshold by comparing the high order warpage to a fine wafer alignment error threshold.

12. The method of claim 11, wherein the fine wafer alignment error threshold has a translation and a rotation removed.

13. A method, comprising:
   determine, from a warpage measurements from a plurality of locations on a semiconductor wafer, a low order wafer warpage as a function of location on the semiconductor;
   determine high order warpage as a function of location using the warpage measurements from the plurality of locations on the semiconductor wafer and the determined low order warpage; and
   comparing, for each location, the determined high order warpage to a respective overlay error value associated with the location.

14. The method of claim 13, further comprising determining a threshold for high order warpage when the overlay error at the plurality of locations exceeds an overlay error threshold.

15. The method of claim 14, wherein, for each location, the respective overlay error is a magnitude.

16. The method of claim 14, wherein the high order overlay error threshold includes:
   an upper threshold; and
   a lower threshold.

17. The method of claim 16, wherein the threshold for high order warpage includes:
   an upper threshold; and
   a lower threshold.

18. The method of claim 17, further comprising:
   determining the high order warpage upper threshold and the high order warpage lower threshold by comparing the high order warpage to a fine wafer alignment error threshold.

19. The method of claim 18, wherein the fine wafer alignment error threshold has a translation and a rotation removed.

20. The method of claim 13, further comprising determining a change in a parameter affecting a process used to deposit the thin film is necessary when the high order warpage is above the high order warpage threshold or below the high order warpage threshold.

* * * * *